(12) United States Patent
Dong et al.

(10) Patent No.: US 8,144,511 B2
(45) Date of Patent: Mar. 27, 2012

(54) SELECTIVE MEMORY CELL PROGRAM AND ERASE

(75) Inventors: Yingda Dong, San Jose, CA (US); Tien-chien Kuo, Sunnyvale, CA (US); Gerrit Jan Hemink, Yokohama (JP)

(73) Assignee: SanDisk Technologies Inc., Plano, TX (US)

( * ) Notice: Subject to any disclaimer, the term of this patent is extended or adjusted under 35 U.S.C. 154(b) by 367 days.

(21) Appl. No.: 12/544,113

(22) Filed: Aug. 19, 2009

(65) Prior Publication Data

US 2011/0044102 A1 Feb. 24, 2011

(51) Int. Cl.
*G11C 16/04* (2006.01)

(52) U.S. Cl. ......... 365/185.03; 365/185.18; 365/185.29; 365/185.19

(58) Field of Classification Search ............. 365/185.03, 365/185.18, 185.19, 185.29
See application file for complete search history.

(56) References Cited

U.S. PATENT DOCUMENTS

| | | | |
|---|---|---|---|
| 6,807,095 B2 | 10/2004 | Chen et al. | |
| 6,870,768 B2 | 3/2005 | Cernea et al. | |
| 7,349,260 B2 | 3/2008 | Guterman | |
| 7,443,726 B2 * | 10/2008 | Guterman | 365/185.05 |
| 7,518,911 B2 | 4/2009 | Kamei | |
| 7,924,618 B2 * | 4/2011 | Lee | 365/185.18 |
| 2008/0089130 A1 | 4/2008 | Park | |
| 2008/0094901 A1 | 4/2008 | Park et al. | |
| 2008/0316815 A1 * | 12/2008 | Lin | 365/185.03 |
| 2009/0201733 A1 | 8/2009 | Kim et al. | |
| 2010/0157675 A1 * | 6/2010 | Shalvi et al. | 365/185.03 |

OTHER PUBLICATIONS

International Search Report dated Oct. 22, 2010, PCT Application No. PCT/US2010/045744.

* cited by examiner

*Primary Examiner* — Alexander Sofocleous
*Assistant Examiner* — Hai Pham
(74) *Attorney, Agent, or Firm* — Vierra Magen Marcus & DeNiro LLP

(57) ABSTRACT

Techniques are disclosed herein for programming memory arrays to achieve high program/erase cycle endurance. In some aspects, only selected word lines (WL) are programmed with other WLs remaining unprogrammed. As an example, only the even word lines are programmed with the odd WLs left unprogrammed. After all of the even word lines are programmed and the data block is to be programmed with new data, the block is erased. Later, only the odd word lines are programmed. The data may be transferred to a block that stores multiple bit per memory cell prior to the erase. In one aspect, the data is programmed in a checkerboard pattern with some memory cells programmed and others left unprogrammed. Later, after erasing the data, the previously unprogrammed part of the checkerboard pattern is programmed with remaining cells unprogrammed.

20 Claims, 18 Drawing Sheets

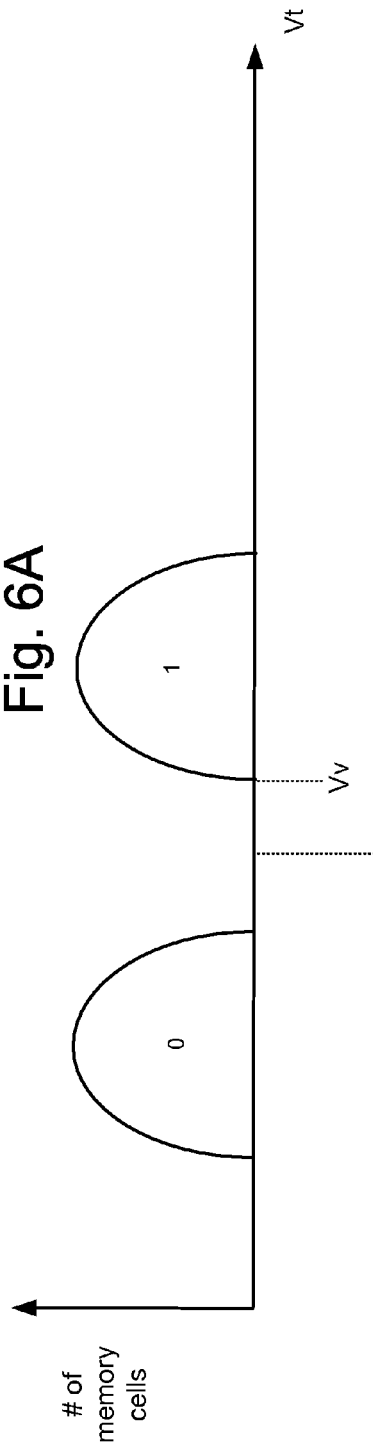
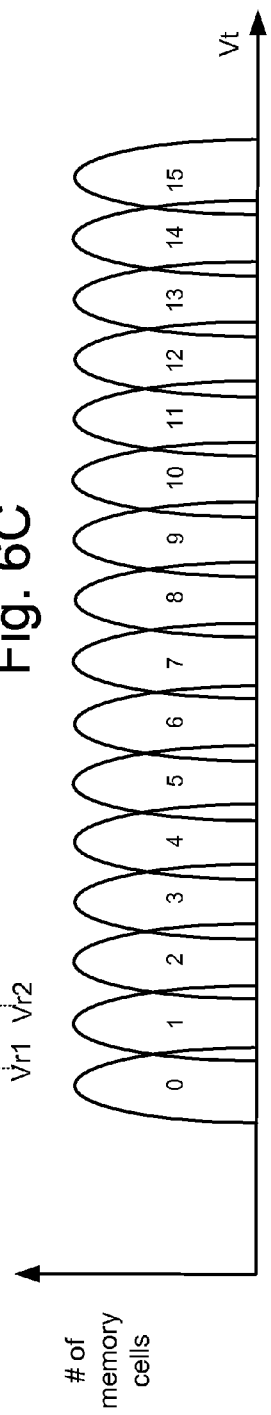

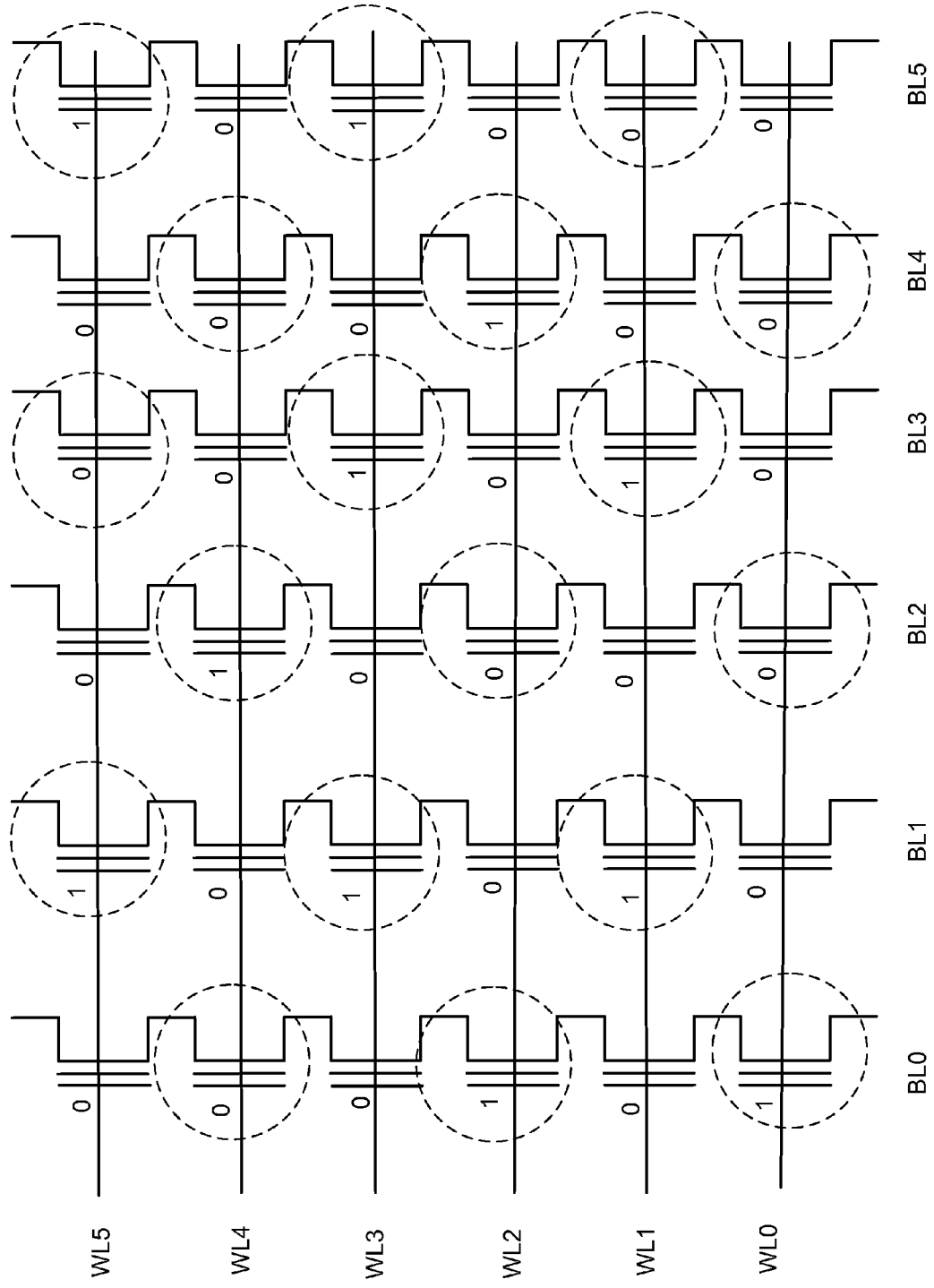

SELECTIVE MEMORY CELL PROGRAM AND ERASE

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Typically, memory cells having a threshold voltage within a first voltage range are considered to be in the erased state and those having a threshold voltage within a second voltage range are considered to be in the programmed state. Typically, there is a window between the first and second range. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Some flash memory devices operate as both binary and multi-states. For example, some memory cells are used to store one bit of data ("single-level cell or SLC blocks") and other memory cells are used to store multiple bits per cell ("multi-level cell or MLC blocks"). For some devices, the SLC blocks and MLC blocks are part of the same integrated circuit, and may even be part of the same memory array. The SLC blocks may be used for short term storage of data, whereas the MLC blocks may be used for long term data storage. In other words, the SLC blocks might be used somewhat like a cache. Thus, the SLC blocks may be programmed/erased many more times over the life of the device than MLC blocks. Therefore, write/erase endurance may be a more significant problem for SLC blocks than for MLC blocks.

For some memory arrays, the array is arranged as a number of parallel word lines and a number of bit lines that run perpendicular to the word lines. Each memory cell may be associated with one word line and one bit line. In certain situations, a memory cell can be affected by the charge stored on the floating gate of an adjacent memory cell on a neighboring word line and/or neighboring bit line.

Shifts in the apparent charge stored on a floating gate of a memory cell can occur because of the coupling of an electric field due to the charge stored in adjacent floating gates. This phenomenon is described in U.S. Pat. No. 5,867,429, which is incorporated herein by reference in its entirety. The problem occurs most pronouncedly between sets of adjacent memory cells that have been programmed at different times. For example, a first memory cell is programmed to add a level of charge to its floating gate that corresponds to one set of data. Subsequently, one or more adjacent memory cells are programmed to add a level of charge to their floating gates that correspond to a second set of data. After the one or more of the adjacent memory cells are programmed, the charge level read from the first memory cell appears to be different than programmed because of the effect of the charge on the adjacent memory cells being coupled to the first memory cell. The coupling from adjacent memory cells can shift the apparent charge level being read a sufficient amount to lead to an erroneous reading of the data stored. Herein, this adjacent floating gate to floating gate effect may be referred to as one type of "adjacent floating gate charge coupling effect."

The charge on an adjacent floating gate can also interfere with the conductive channel in the substrate below the floating gate of a memory cell. Specifically, the charge on the adjacent floating gate may impact how strongly the channel of another memory cell conducts a current. Thus, if the charge stored in an adjacent floating gate changes, then it may require a greater (or smaller) voltage on the control gate the other memory cell to create the same current in the channel. The net impact is that the amount of charge stored on the memory cell appears to be different due to the change in the charge stored in the adjacent floating gate. This problem is most pronounced between sets of adjacent memory cells that have been programmed at different times. Herein, this adjacent floating gate to channel effect may be referred to as another type of "adjacent floating gate charge coupling effect."

Another problem with memory cells is that over time charge can accumulate in a dielectric near the floating gate. For example, when programming a memory cell, charge can become trapped in a tunnel oxide layer below the floating gate of the memory cell. Erasing the memory cell may not completely remove the trapped charge. With each program/erase cycle, the amount of trapped charge increases.

As memory cells continue to shrink in size, the associated reduction in space between memory cells may increase the adjacent floating gate charge coupling effects. As the number of program/erase cycles increases, the charge trapping around adjacent floating gates exacerbates the floating gate charge coupling effects. For memory cells which undergo many program/erase cycles, the large adjacent floating gate charge coupling effects severely shrinks the difference between the threshold voltage ranges. For example, the gap between the range of threshold voltages that represents a "1" and "0" decreases. To guarantee reliability and avoid read errors, there should be a certain amount of threshold voltage separation between the "1" state and the "0" state.

BRIEF DESCRIPTION OF THE DRAWINGS

FIG. 6A-6C depict example threshold voltage distributions.

FIGS. 11A and 11B depict example checkerboard pattern that result after programming memory cells on odd and even word lines.

DETAILED DESCRIPTION

Techniques are disclosed herein for programming memory arrays in a way that achieves high program/erase cycle endurance. Techniques reduce floating gate charge coupling effects between word lines, which can increase the endurance of memory cells. Techniques reduce floating gate charge coupling effects between bit lines, which can increase the endurance of memory cells. Techniques provide for a wide window between threshold voltage distribution states. In some aspects, the techniques are applied to SLC blocks in a memory array that also includes MLC blocks.

In one aspect, only certain selected word lines (WL) in the block are programmed. Other WLs are left erased (unprogrammed). This reduces or eliminates WL-WL floating gate charge coupling effects. Initially, the entire group of memory cells (e.g., block) may be erased. When a WL is programmed both neighboring WLs (WLn−1 and WLn+1) are left in the erased state without being programmed. In this example, "n" might be even integers or, alternatively, odd integers. As an example, only the even word lines are programmed. After all of the even word lines are programmed and the data block is to be programmed with new data, the block is erased. Note that when erasing the block, memory cells on the odd WLs do not need to be erased which reduces stress on memory cells on the odd WLs. Later, only odd WLs are programmed.

One aspect is operating memory arrays having SLC blocks and MLC blocks. In one aspect, the even/odd programming discussed in the previous paragraph is applied to SLC blocks. After, for example, memory cells on even WLs in several SLC blocks are programmed with data, the data is transferred to one or more MLC blocks. Then, the SLC blocks are erased and the odd word lines in the SLC blocks may be programmed.

In one aspect, programming a block or other unit is performed in a checkerboard pattern. For example, on the even WLs, only the even memory cells are programmed and on the odd WLs only the odd memory cells are programmed. Later, when new data is to be stored in the block, the checkerboard pattern is reversed such that on even WLs only the odd memory cells are programmed and on the odd WLs only the even memory cells are programmed. This programming scheme may reduce or eliminate both WL-WL floating gate charge coupling effects, as well as bit line to bit line floating gate charge coupling effects.

In one aspect, the checkerboard pattern programming discussed in the previous paragraph is applied to SLC blocks. After, for example, several SLC blocks are programmed using the checkerboard pattern, the data is transferred to one or more MLC blocks. Then, the SLC blocks are erased and the inverse of the checkerboard pattern may be used to program the SLC blocks.

Figure 1:
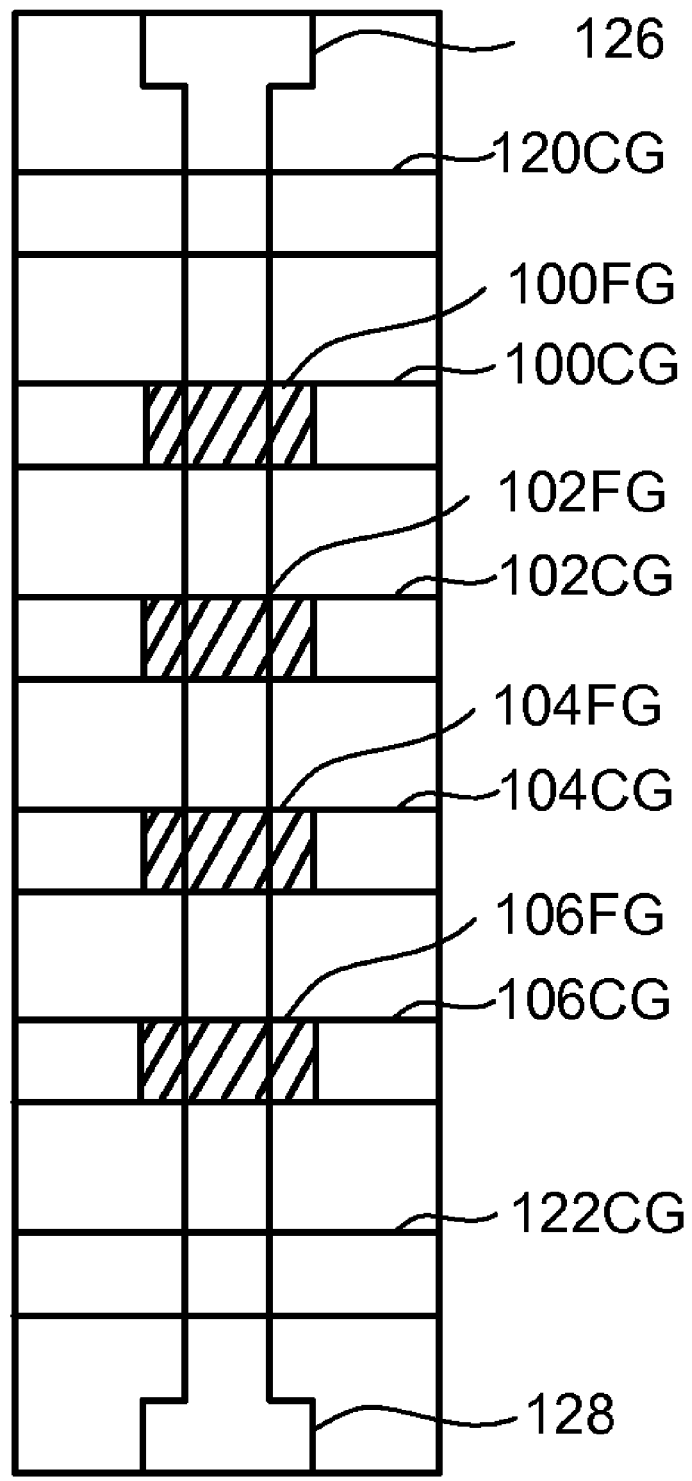
FIG. 1 is a top view of a NAND string.

The techniques described herein are applicable to a wide range of memory arrays. The following is one example NAND architecture. However, techniques described herein are not limited to this example. One example of a flash memory system uses the NAND structure, which includes arranging multiple floating gate transistors in series between two select gates. The transistors in series and the select gates are referred to as a NAND string. FIG. 1 is a top view showing one NAND string. The NAND string depicted in FIG. 1 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

A typical architecture for a flash memory system using a NAND structure will include many NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Figure 2:
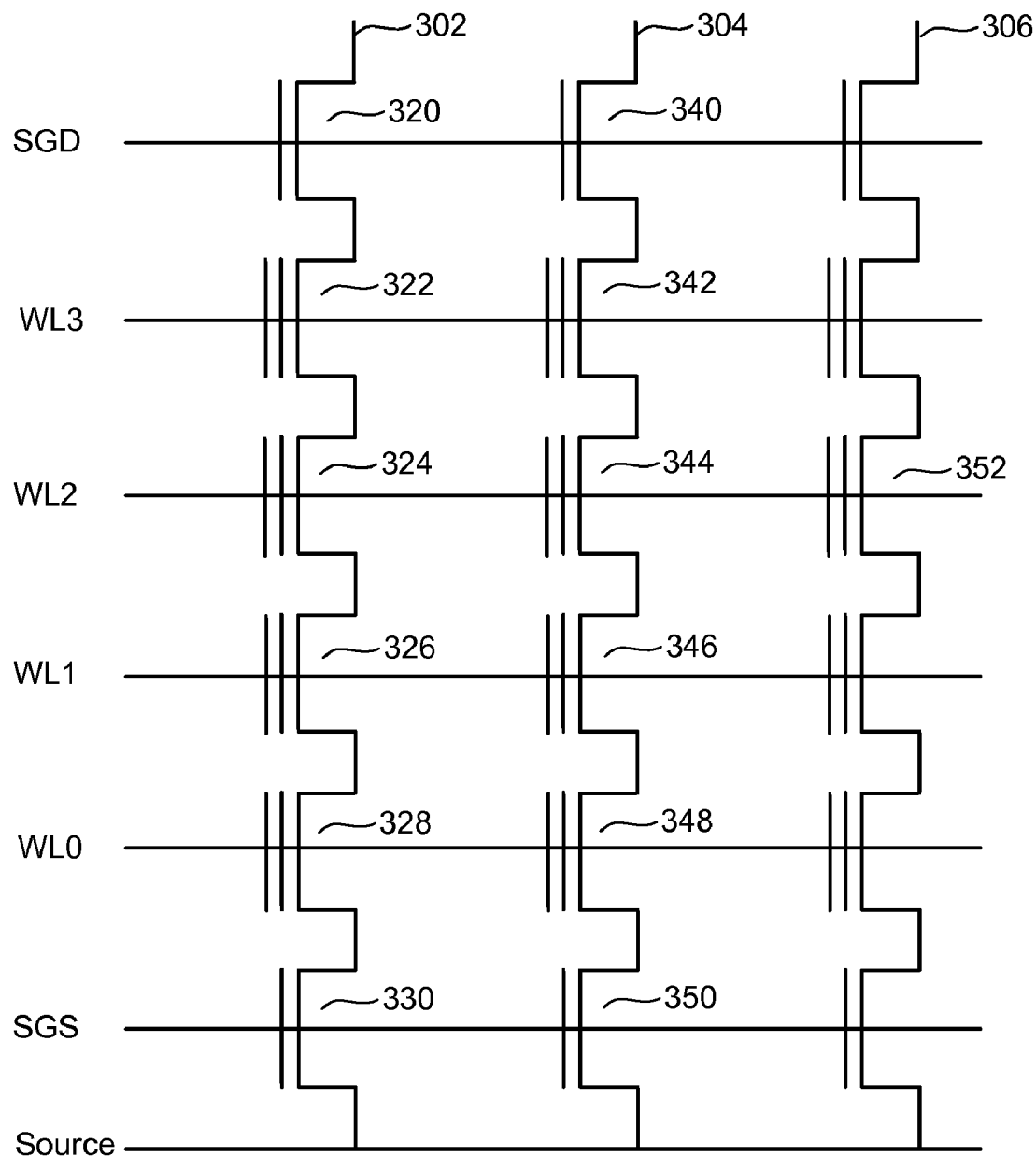
FIG. 2 is a circuit diagram of three NAND strings with associated word lines.

FIG. 2 shows three NAND strings 302, 304 and 306 of a memory array having many more NAND strings. Each of the NAND strings of FIG. 2 includes two select transistors and four memory cells. For example, NAND string 302 includes select transistors 320 and 330, and memory cells 322, 324, 326 and 328. NAND string 304 includes select transistors 340 and 350, and memory cells 342, 344, 346 and 348. Each NAND string is connected to the source line by its select transistor (e.g. select transistor 330 and select transistor 350). A selection line SGS is used to control the source side select gates. The various NAND strings are connected to respective bit lines by select transistors 320, 340, etc., which are controlled by select line SGD. In other embodiments, the select lines do not necessarily need to be in common. Word line WL3 is connected to the control gates for memory cell 322 and memory cell 342. Word line WL2 is connected to the control gates for memory cell 324, memory cell 344, and memory cell 352. Word line WL1 is connected to the control gates for memory cell 326 and memory cell 346. Word line WL0 is connected to the control gates for memory cell 328 and memory cell 348. As can be seen, each bit line and the respective NAND string comprise the columns of the array of memory cells. The word lines (WL3, WL2, WL1 and WL0) comprise the rows of the array.

Note that a NAND string can have fewer or more memory cells than depicted in FIG. 2. For example, some NAND strings will include eight memory cells, 16 memory cells, 32 memory cells, 64 memory cells, 128 memory cells, etc. The discussion herein is not limited to any particular number of memory cells in a NAND string. Furthermore, a word line can have more or fewer memory cells than depicted in FIG. 2. For example, a word line can include thousand or tens of thousands of memory cells. The discussion herein is not limited to any particular number of memory cells in a word line.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after programming is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

In the case of storing multiple levels of data, the range of possible threshold voltages is divided into the number of levels of data. For example, if four levels of information is stored (two bits of data), there will be four threshold voltage ranges assigned to the data values "11", "10", "01", and "00." In one example of a NAND type memory, the threshold voltage after an erase operation is negative and defined as "11". Positive threshold voltages are used for the data states of "10", "01", and "00." If eight levels of information (or states) are stored (e.g. for three bits of data), there will be eight threshold voltage ranges assigned to the data values "000", "001", "010", "011" "100", "101", "110" and "111."

The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted or otherwise randomized to reduce data pattern sensitivity and even wear on the memory cells.

Relevant examples of NAND type flash memories and their operation are provided in the following U.S. patents/patent applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348. The discussion herein can also apply to other types of flash memory in addition to NAND as well as other types of non-volatile memory. For example, the following patents describe NOR type flash memories and are incorporated herein by reference in their entirety: U.S. Pat. Nos. 5,095,344; 5,172,338; 5,890,192 and 6,151,248.

Other types of non-volatile storage devices, in addition to NAND flash memory, can also be used. For example, a so called TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used with the present invention. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The memory cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar memory cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. Other types of memory devices can also be used.

Figure 3:
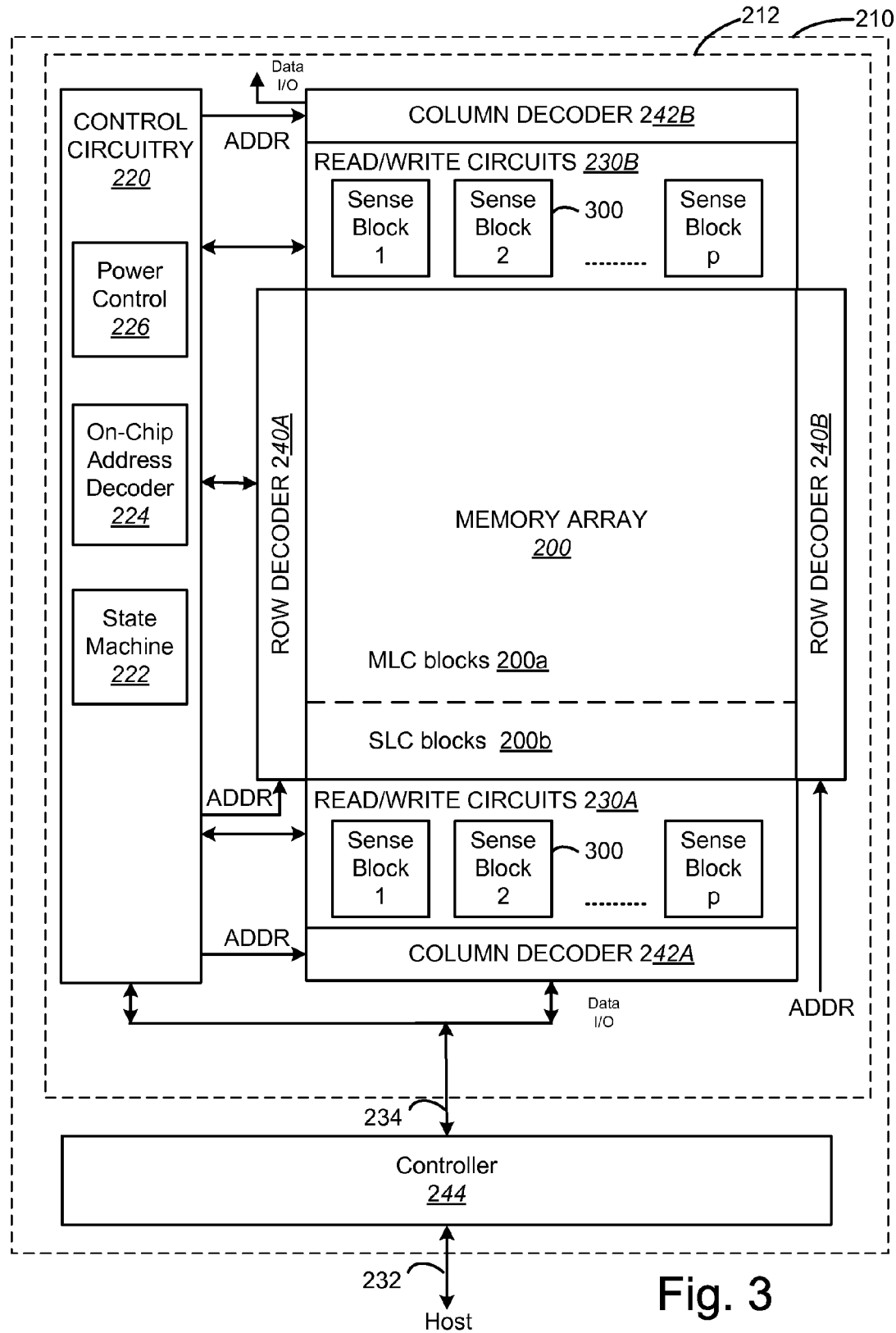
FIG. 3 is a block diagram of an array of NAND flash storage elements.

FIG. 3 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface to convert between the address that is used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

The memory array 200 includes an MLC block region 200a and an SLC block region 200b. An SLC block and an MLC block may have the same number of memory cells for user data; however, because an MLC block stores multiple bits per cell an MLC block may store 2, 3, 4, etc. times as much data as an SLC block. It is not required that SLC blocks and MLC blocks have the same number of memory cells. Typically, the data stored in the MLC blocks is processed with a stronger ECC algorithm than that used in SLC blocks in order to provide greater reliability. Such strong ECC is generally not required with SLC blocks. A region 200b of the memory array 200 having SLC blocks will be referred to as "an SLC region 200b" and a region 200a of the memory array 200 having MLC blocks will be referred to as "an MLC region 200a." Note that in some embodiments, the SLC block area 200b and MLC block area 200a do not have to be predefined areas. In some embodiments, all blocks in memory array 200 can be used as either SLC or MLC blocks. For example, a block can be used as an SLC block at one time and as an MLC block at another time. In other embodiments, the controller 244 defines certain blocks as SLC and MLC blocks respectively.

In some embodiments, when the controller 244 receives user data it is first stored in one or more SLC blocks. However, the controller 244 does not necessarily program all of the memory cells in the SLC block. In one aspect, the controller 244 programs only selected word lines (e.g., only odd or only even WLs). In one aspect, the controller 244 programs memory cells in a checkerboard pattern. At some point, the controller 244 may transfer the user data stored in the SLC blocks into one or more MLC blocks. As an example, if the MLC blocks each store two times as much data as an SLC block is capable of storing, the controller 244 may wait until four SLC blocks are programmed and then read in that data, perform ECC encoding, and store the data into a single MLC block. Note that it is not required that all of the memory cells in the SLC block are programmed prior to the transfer to the MLC block. Also note that this technique may result in data being stored in MLC blocks for longer periods of time than in SLC blocks, but that is not required.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 4:
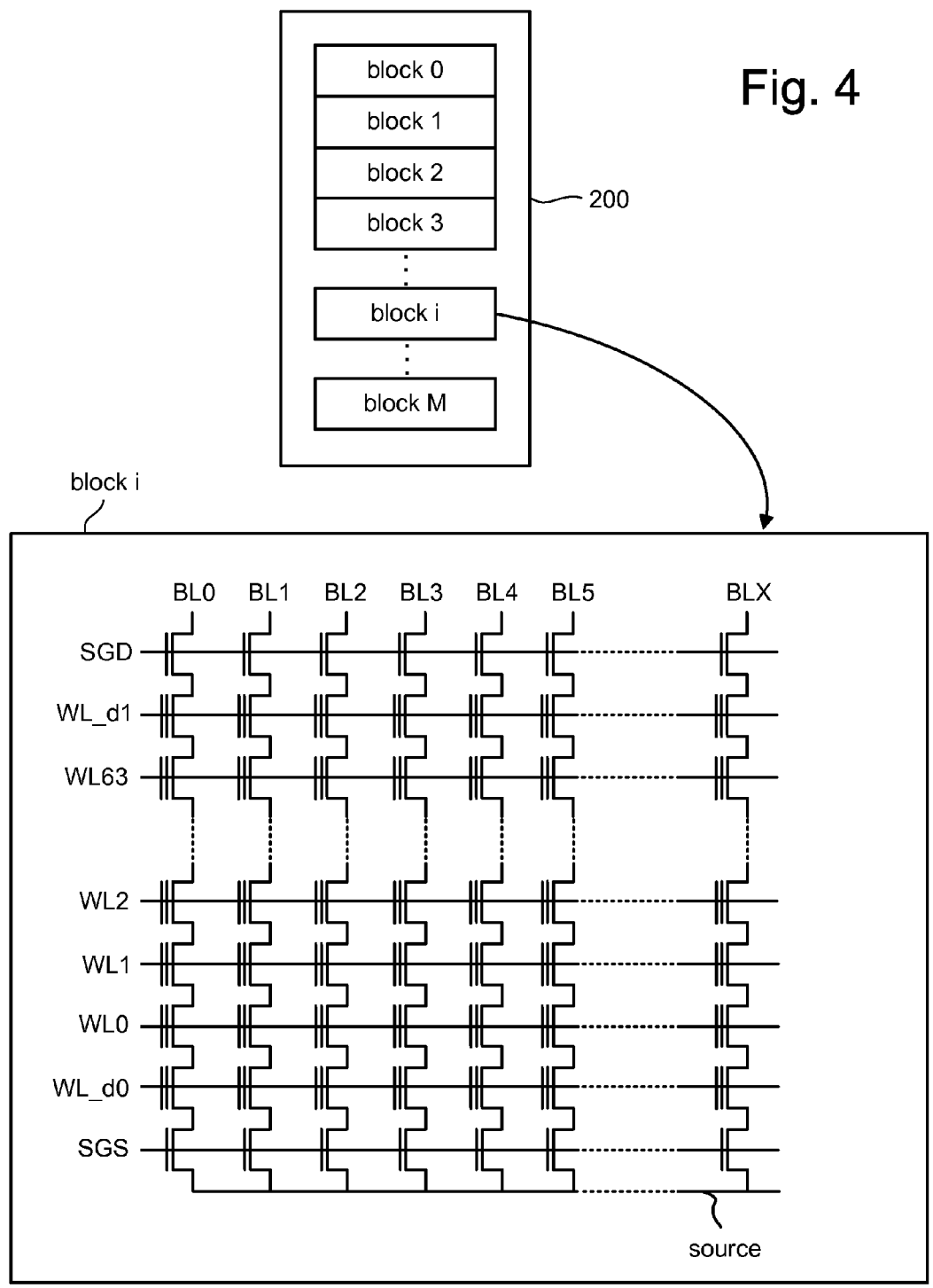
FIG. 4 is a block diagram depicting one embodiment of a memory array.

FIG. 4 depicts an exemplary structure of memory cell array 200. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 4 also shows more details of block i of memory array 200. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and more or fewer dummy memory cells. Data memory cells can store user or system data. Dummy memory cells are typically not used to store user or system data. Some embodiments do not include dummy memory cells.

Figure 5:
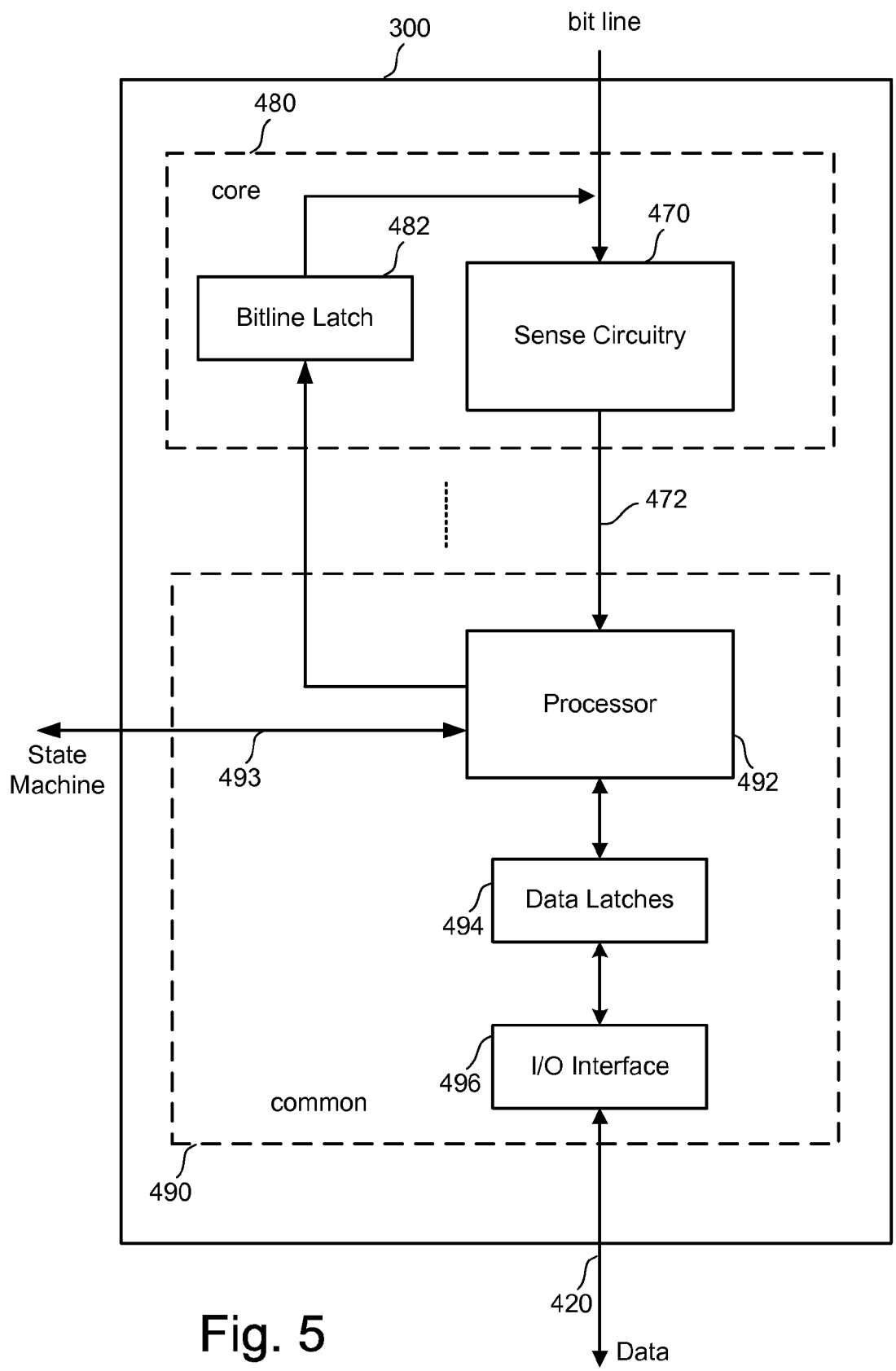
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, filed Dec. 29, 2004, and titled, "Non-volatile memory and method with shared processing for an aggregate of read/write circuits," which is hereby incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 420. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are 3-5 (or another number) data latches per sense module 480. In one embodiment, the latches are each one bit. In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

At the end of a successful programming process (with verification), the threshold voltages of the memory cells should be within one or more distributions of threshold voltages for programmed memory cells or within a distribution of threshold voltages for erased memory cells, as appropriate. FIG. 6A depicts example Vt distributions for states of memory cells in an SLC block. FIG. 6B illustrates example Vt distributions corresponding to data states for the memory cell array when each memory cell stores four bits of data. Such a distribution may be used for programming an MLC block. Other embodiments, however, may use more or fewer than four bits of data per memory cell. FIG. 6B shows 16 Vt distributions corresponding to data states 0-15. In some embodiments, the threshold voltages in state 0 are negative and the threshold voltages in the states 1-15 are positive. However, the threshold voltages in one or more of states 1-15 may be negative.

Between each of the data states 0-15 are read reference voltages used for reading data from memory cells. For example, FIG. 6B shows read reference voltage Vr1 between data states 0 and 1, and Vr2 between data states 1 and 2. By testing whether the threshold voltage of a given memory cell is above or below the respective read reference voltages, the system can determine what state the memory cell is in.

At or near the lower edge of each data state 0-15 are verify reference voltages. For example, FIG. 6B shows Vv1 for state 1 and Vv2 for state 2. When programming memory cells to a given state, the system will test whether those memory cells have a threshold voltage greater than or equal to the verify reference voltage.

FIG. 6C illustrates that another embodiment of Vt distributions corresponding to data states 0-15 can partially overlap because an error correction algorithm can handle a certain percentage of cells that are in error. Also note that the Vt axis may be offset from actual voltages applied to the control gates as body effect through source or body biasing is used to shift negative threshold voltage into the measurable positive range. Another point to note is that contrary to the equal spacing/width of the depicted sixteen states, various states may have different widths/spacings in order to accommodate varying amounts of susceptibility to data retention loss. In some embodiments, states 0 and/or 15 are wider than the other states.

Referring again to FIG. 6A, State 0 may be an erase distribution that results from erasing all memory cells in an SLC block. The erase verification voltage is not explicitly depicted but may be just at the right edge of the erase distribution. When an SLC block is programmed, the system moves the threshold voltage of selected memory cells to distribution 1. The system verifies whether memory cells are programmed to a threshold voltage of Vv for state 1. After programming has been completed, the system reads memory cells by comparing their threshold voltage with Vr.

Figure 7A:
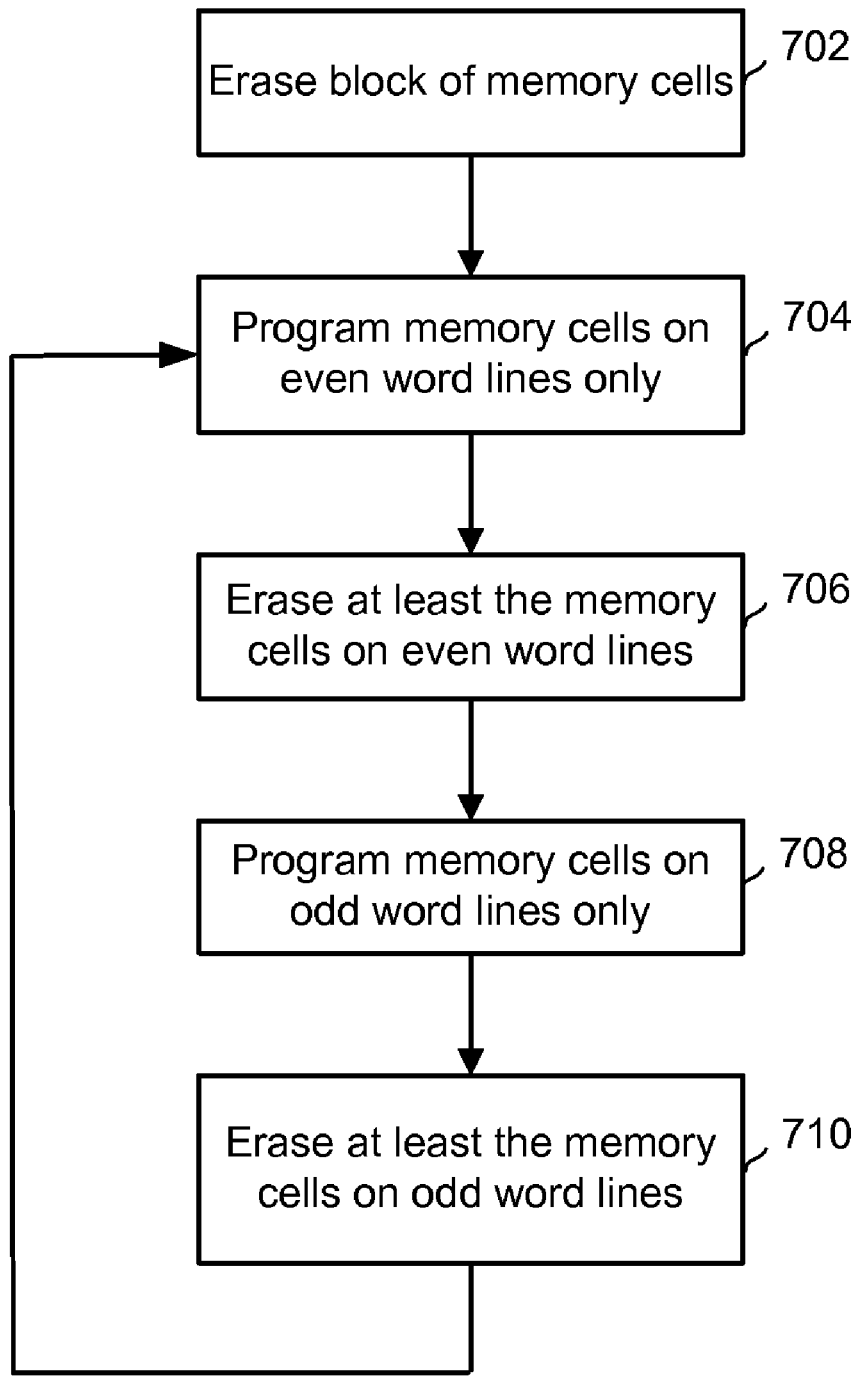
FIG. 7A depicts one embodiment of a process of programming a block of memory cells in a memory array.

FIG. 7A depicts one embodiment of a flowchart of a process 700 of programming a block of memory cells in a memory array 200. In one embodiment, process 700 is applied to SLC blocks but not to MLC blocks. However, process 700 may also be applied to MLC blocks.

In step 702, a block of memory cells in the memory array is erased. In one aspect, the block is an SLC block, but process 700 in not limited to SLC blocks. Thus, in one aspect, the block is an MLC block. Details of erasing a block of memory cells are discussed below in connection with the discussion of FIG. 14. In step 702, all memory cells in the block are erased.

Figure 8A:
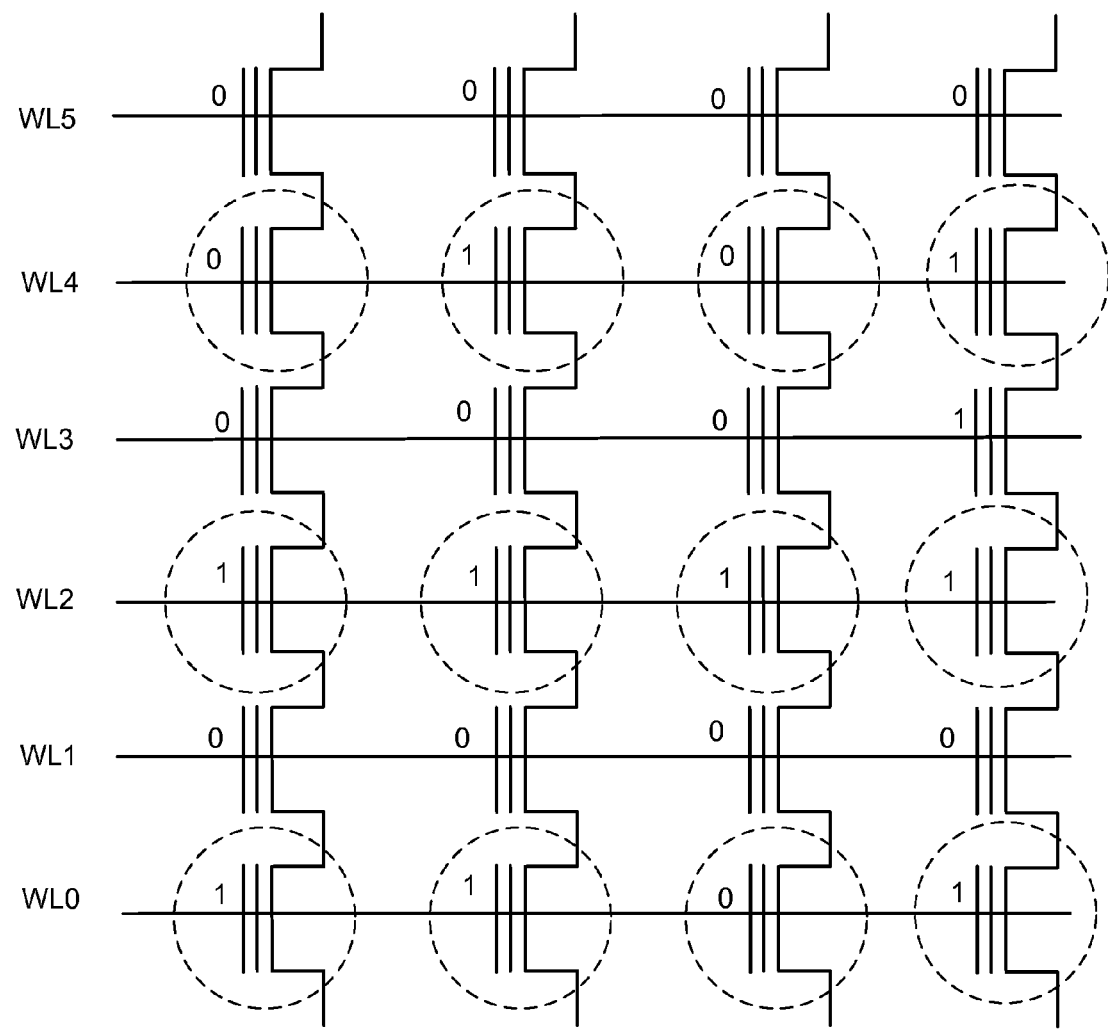
FIGS. 8A and 8B depict example patterns that result after programming memory cells on odd and even word lines.

In step 704, memory cells associated with even word lines are programmed. However, memory cells on the odd word lines remain erased (unprogrammed). FIG. 8A depicts an example pattern that results after programming memory cells on even word lines, but keeping memory cells on odd word lines erased. The memory cells that are encircled by dashed lines are those that are programmed with data. In FIG. 8A, on WL1, WL3 and WL5 the memory cells all have a "0" indicating that they have remained erased. Memory cells on WL0, WL2 and WL4 have either a "1" or a "0" indicating that those memory cells have been programmed with data. Herein, the phrase "programming a group of memory cells", "programming data in a group of memory cells", "a programmed word line," or similar phrases will be understood to mean that the threshold voltage of the memory cells are set to the appropriate level to represent data. It will be understood that there may be some memory cells for which the threshold voltage does not need to change in order to program data into that memory cell. For example, some of the memory cells on WL0, WL2, WL4 have had their threshold voltage changed from the erase threshold voltage (state 0 in FIG. 6A) to a programmed threshold voltage (e.g., state 1 in FIG. 6A). However, some memory cells on WL0, WL2, WL4 remain in the erase threshold voltage (e.g., state 0 in FIG. 6A) to represent a binary "0". Note that the erased state could also represent binary "1." Also note that programming could involve changing the threshold voltage to another state such as any of states 2-15 in FIGS. 6B and 6C. In other words, the block might be an MLC block. Typically, there will be many more word lines in a block. For example, there might be 64 or more word lines. Also, there are typically many more bit lines in a block. For example, there might be thousands of bit lines.

In step 706, memory cells on at least the even word lines are erased. Because the memory cells on the odd word lines were not programmed since the complete block erase in step 702, those memory cells do not need to be erased. Details of erasing memory cells on selected word lines are discussed with respect to FIG. 14. In some embodiments, memory cells on the even word lines are erased in a normal manner, whereas memory cells on odd word lines are only weakly erased. Weak erase is discussed in more detail below. The erase may be triggered by a variety of events. In one aspect, SLC blocks are programmed until enough are programmed to warrant transfer to one or more MLC blocks. After the data transfer to MLC blocks, the data in the SLC blocks may be erased. The erase might also be triggered by the host sending a command to the controller 244 that indicates that all data in the block is to be erased or written with new data. Thus, it is not required that the data from the block be transferred to another block prior to the erase. Selectively erasing memory cells on certain word lines (e.g., only even word lines) is discussed in connection with FIG. 14.

Figure 8B:
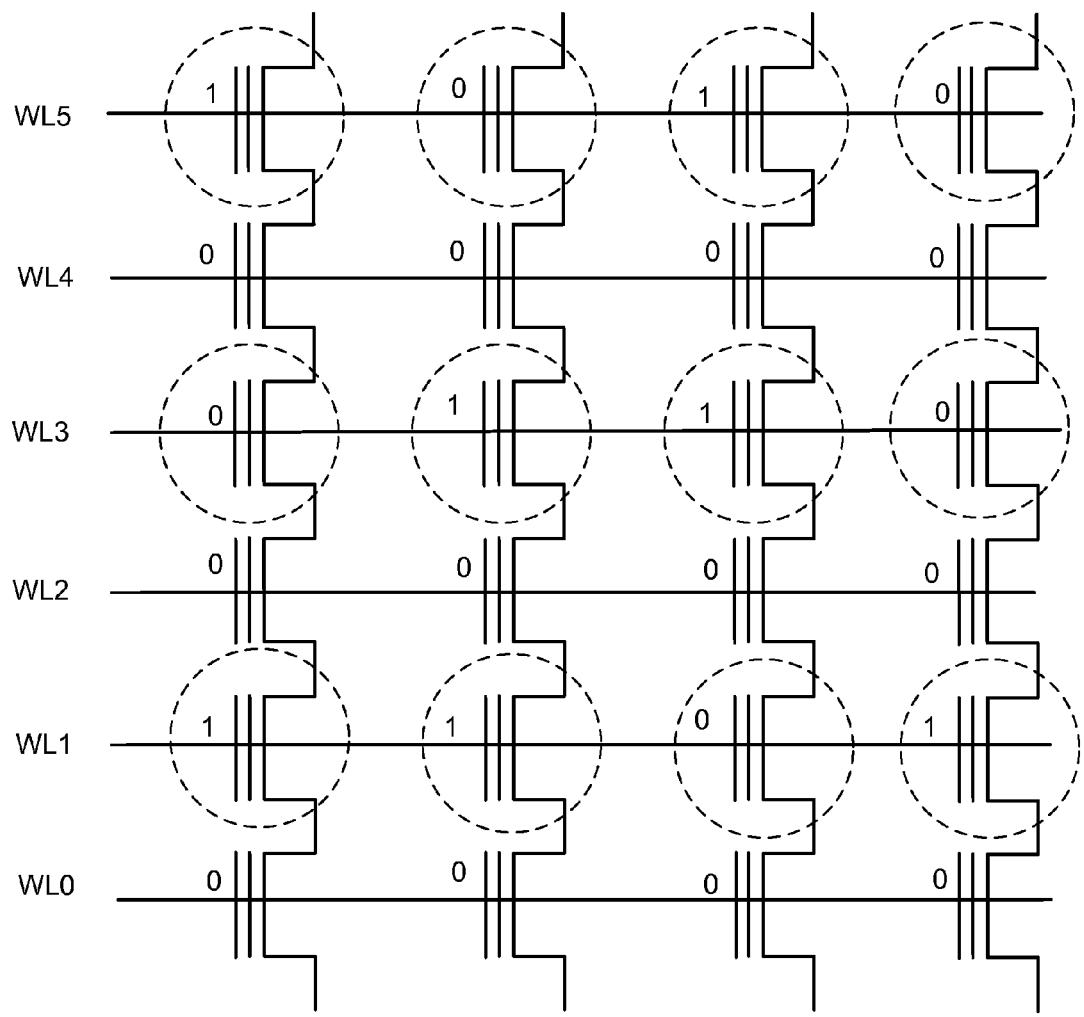

In step 708, memory cells on odd word lines are programmed. However, memory cells on the even word lines remain erased (or unprogrammed). FIG. 8B depicts an example pattern that results after programming memory cells on odd word lines, but keeping memory cells on even word lines erased. In FIG. 8B, for WL0, WL1 and WL3 the memory cells all have a "0" indicating that they are erased. Memory cells on WL1, WL3 and WL5 have either a "1" or a "0" indicating that those memory cells have been programmed. For example, some of the memory cells have had their threshold voltage changed from the erase threshold voltage (state 0 in FIG. 6A) to a programmed state (e.g., state 1 in FIG. 6A). Note that programming could involve changing the threshold voltage to another state such as any of states 2-15 in FIGS. 6B and 6C.

In step 710, at least the memory cells on the odd word lines are erased. This is similar to step 706 for even word lines and will not be discussed in detail. Note that it is not required that an alternating sequence of programming odd, then even, then odd, then even word lines be maintained. In one aspect, counts are maintained of the number of program/erase cycles for the odd word lines and for the even word lines. Even WLs might be programmed/erased multiple times in succession prior to programming and erasing the odd WLs. Over time, the even and odd word lines receive the same number of program/erase cycles to level the wear. A count of the program/erase cycles for even and odd WLs might be stored in free memory cells of the data block itself. That is, there may be a certain number of memory cells in each block that are not for user data. Alternatively, the count could be stored elsewhere, such as a different block in the memory array 200 or memory outside of the memory array 200. Thus, in one aspect, steps 704 and 706 (program/erase even WLs) may be repeated many times prior to performing steps 708 and 710 (program/erase odd WLs).

In other embodiments, rather than programming even and odd WLs, some other pattern is used. In one embodiment, the pattern has at least one unprogrammed WL between each programmed WL. For example, every third word line is programmed while the WLs in between remain erased. As a specific example, WL0, WL3, WL6, WL9, etc., are programmed, whereas WL1, WL2, WL4, WL5, WL7, WL8, etc., remain erased. After erasing WL0, WL3, WL6, WL9, etc., a new group of word lines is selected for programming. For example, WL1, WL4, WL7, WL10, etc., are programmed, whereas WL0, WL2, WL3, WL5, WL6, WL8, etc., remain erased. Other programming patterns, such as a checkerboard pattern are discussed below.

By keeping at least one WL unprogrammed next to each programmed WL, at least some floating gate charge coupling effects may be reduced or eliminated. For example, those effects that might otherwise arise from programming a memory cell on a WL above or below a given WL are greatly reduced or eliminated. Reducing this WL-WL floating gate charge coupling effect may increase the endurance of the block. Furthermore, the window between the states (e.g., the erase state and programmed state) may be increased.

Figure 7B:
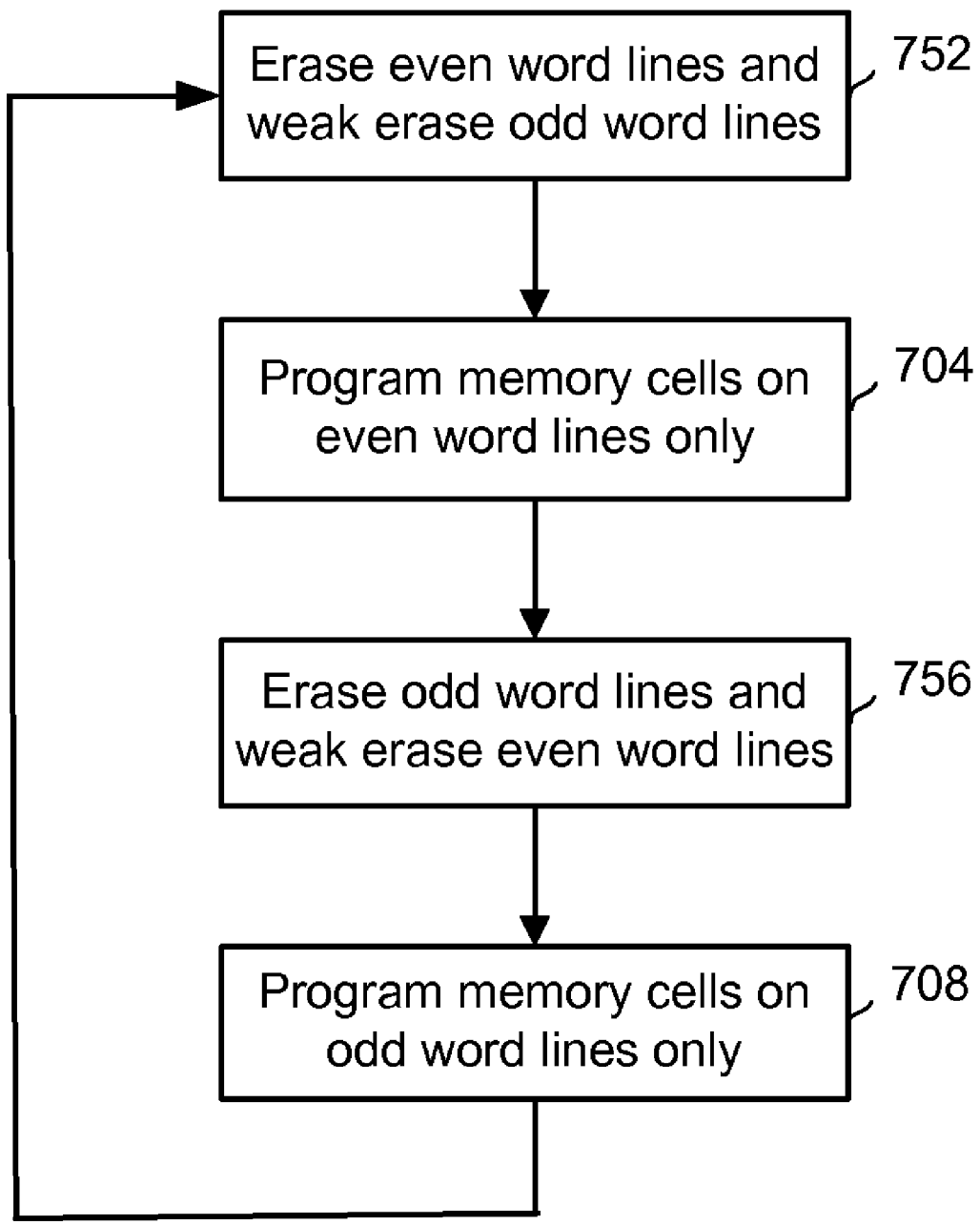
FIG. 7B depicts another embodiment of a process of programming a block of memory cells in a memory array.

FIG. 7B depicts one embodiment of a flowchart of a process 750 of programming a block of memory cells in a memory array 200. In one embodiment, process 750 is applied to SLC blocks but not to MLC blocks. However, process 750 may also be applied to MLC blocks. In process 750, WLs receive a normal erase just before they are programmed, whereas WLs that are not to be programmed at this time are only weakly erased. The WLs that are not to be programmed at this time are weakly erased as they may contain data.

In step 752, even word lines receive a normal erase and odd word lines are weakly erased. In one embodiment, a "weak erase" is achieved by applying a different bias condition to word lines of memory cells to be weakly erased than the bias condition that is normally applied to the erase memory cells. Providing a normal erase to some memory cells (e.g., only memory cells on even word lines) while weakly erasing memory cells on other word lines is discussed in connection with FIG. 14. In step 704, memory cells associated with even word lines are programmed. However, memory cells on the odd word lines are not programmed. Step 704 has already been discussed in connection with process 700. In step 756, odd word lines receive a normal erase and even word lines are weakly erased. In step 708, memory cells on odd word lines are programmed without programming memory cells on the even word lines. Process 750 then returns to step 752 to erase even WLs (applying the normal bias condition to word lines, for example) and weakly erase odd word lines. Numerous variations of process 750 similar to the variations of process 700 are possible.

Figure 9A:
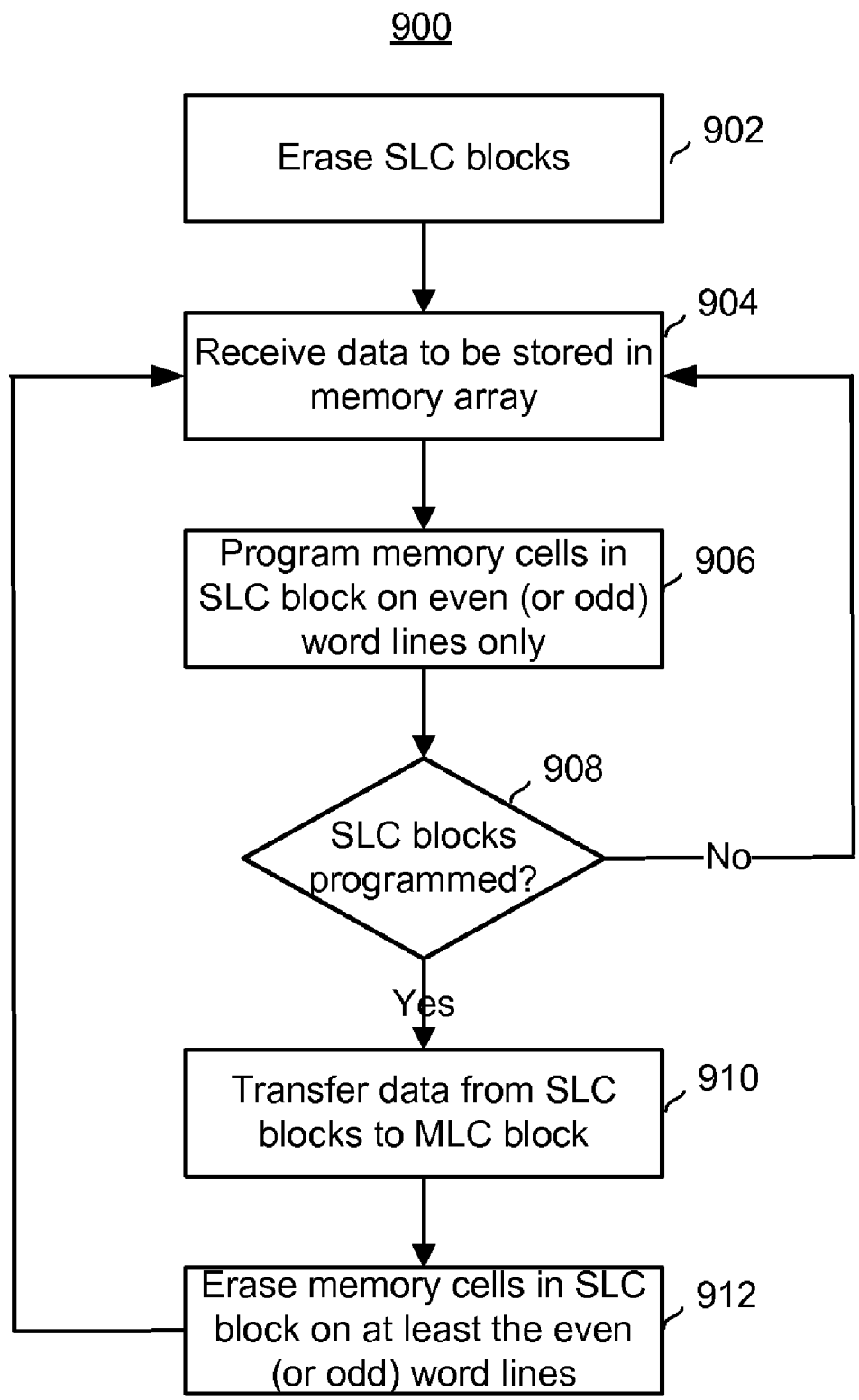
FIG. 9A depicts one embodiment of a process programming SLC and MLC blocks.

FIG. 9A depicts one embodiment of a process 900 programming SLC and MLC blocks. For purposes of discussion, an example of programming eight SLC blocks and transferring that data to one MLC block will be discussed. In this example, it takes eight SLC blocks that have only even WLs (or alternatively odd WLs) programmed to fill one MLC block, although it may take more or fewer SLC blocks to fill an MLC block. In step 902, SLC blocks are erased. Thus, at least the eight SLC blocks are erased.

In step 904, the controller 244 receives data to be stored in the memory array 200. For example, a host sends the controller 244 user data to store. In process 900, the controller 244 determines that the data should first be stored in SLC blocks prior to transferring the data to MLC blocks. As previously discussed, the SLC blocks may be used as a type of cache to temporarily store the data.

In step 906, memory cells on even WLs of at least one of the SLC blocks are programmed with the received data. The controller 244 may program the data into more than one SLC block. If so, the controller 244 might program only even WLs of one SLC block and only odd WLs of another SLC block. Thus, it is not a requirement that at one point in time all of the SLC blocks have their even WLs programmed. However, for clarity of discussion an example will be used in which even WLs are programmed in each of the SLC blocks.

In step 908, the controller 244 determines whether enough SLC blocks are programmed to warrant transfer of the data to one or more MLC blocks. For example, the controller 244 determines whether all of the even word lines on eight SLC blocks are programmed. If not, process 900 returns to step 904 to receive more data to be stored in the memory array at least until enough SLC blocks are programmed to warrant transfer to MLC blocks.

Note that it is not required that the data from the SLC blocks be transferred to an MLC block as soon as possible. The controller 244 may wait until memory access is idle (e.g., the host is not accessing the memory array 200) to transfer data from SLC blocks to one or more MLC blocks. In this case, other SLC blocks are programmed until an appropriate time to transfer the data to MLC blocks.

When the controller 244 determines it is appropriate, data is transferred from the SLC blocks to one or more MLC blocks, in step 910. Note that at this point, the memory cells on the odd WLs have remained erased (unprogrammed). In the present example, the controller 244 reads in the data from the even WLs of the eight SLC blocks, applies ECC to the data and then stores the data in the MLC block. It is not required that the even/odd programming of WLs be applied to MLC blocks. Thus, memory cells on every WL of an MLC block may be programmed.

In step 912, memory cells in the SLC blocks are erased. Only those WLs that were programmed need to be erased. For example, all of the even WLs are erased in each of the SLC blocks for which data was transferred. In some embodiments, the even WLs receive a normal erase, whereas the odd WLs receive a weak erase. Note that it is not a requirement that only half the word lines are erased. After step 912, process 900 returns to step 904 to receive more data to be stored in the memory array 200. However, this time data may be stored in odd WLs of each of the SLC blocks.

As with the example of FIG. 7A, it is not required that a strict even/odd WL pattern be used in process 900. For example, the even word lines may be programmed many times prior to programming the odd word lines. A count of the program/erase cycles for the even and for the odd word lines may be maintained to allow for wear leveling. In other embodiments, rather than programming even and odd WLs some other pattern is used. In one embodiment, the pattern has at least one unprogrammed WL between each programmed WL. For example, every third word line is programmed while the WLs in between remain erased. As a specific example, WL0, WL3, WL6, etc., are programmed, whereas WL1, WL2, WL4, WL5, WL7, WL8, etc., remain erased. After erasing WL0, WL3, WL6, etc., a new group of word lines is selected for programming. For example, WL1, WL4, WL7, etc., are programmed, whereas WL0, WL2, WL3, WL5, WL6, WL8, etc., remain erased.

Figure 9B:
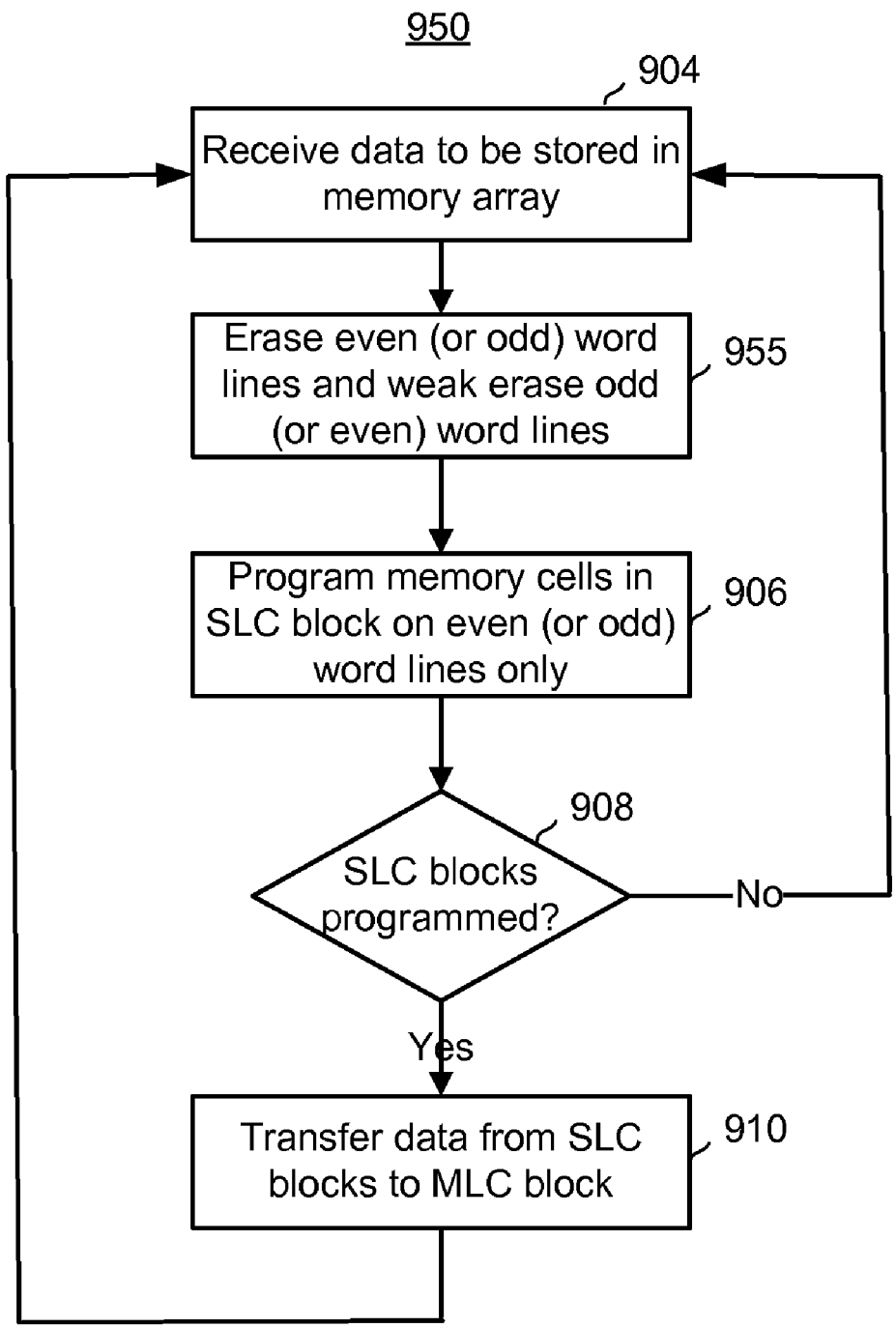
FIG. 9B depicts another embodiment of a process programming SLC and MLC blocks.

FIG. 9B depicts one embodiment of a process 950 programming SLC and MLC blocks. In this embodiment, word lines are erased just prior to programming. Word lines that are not to be programmed may be weakly erased. Process 950 is similar to process 900 and will not be discussed in detail.

In step 904, the controller 244 receives data to be stored in the memory array 200. In step 955, even word lines receive a normal erase and odd word lines are weakly erased. In step 906, memory cells on even WLs of at least one of the SLC blocks are programmed with the received data. The controller 244 may program the data into more than one SLC block. If so, the controller 244 might program only even WLs of one SLC block and only odd WLs of another SLC block. Thus, it is not a requirement that at one point in time all of the SLC blocks have their even WLs programmed. However, for clarity of discussion an example will be used in which even WLs are programmed in each of the SLC blocks.

In step 908, the controller 244 determines whether enough SLC blocks are programmed to warrant transfer of the data to one or more MLC blocks. If not, process 950 returns to step 904 to receive more data to be stored in the memory array at least until enough SLC blocks are programmed to warrant transfer to MLC blocks. When the controller 244 determines it is appropriate, data is transferred from the SLC blocks to one or more MLC blocks, in step 910. Note that at this point, the memory cells on the odd WLs have remained weakly erased (unprogrammed).

In step 962, memory cells associated with odd WLs receive a normal erase and memory cells associated with even WLs are weakly erased. After step 962, process 950 returns to step 904 to receive more data to be stored in the memory array 200. However, this time data may be stored in odd WLs of each of the SLC blocks (with even WLs remaining unprogrammed).

Figure 10:
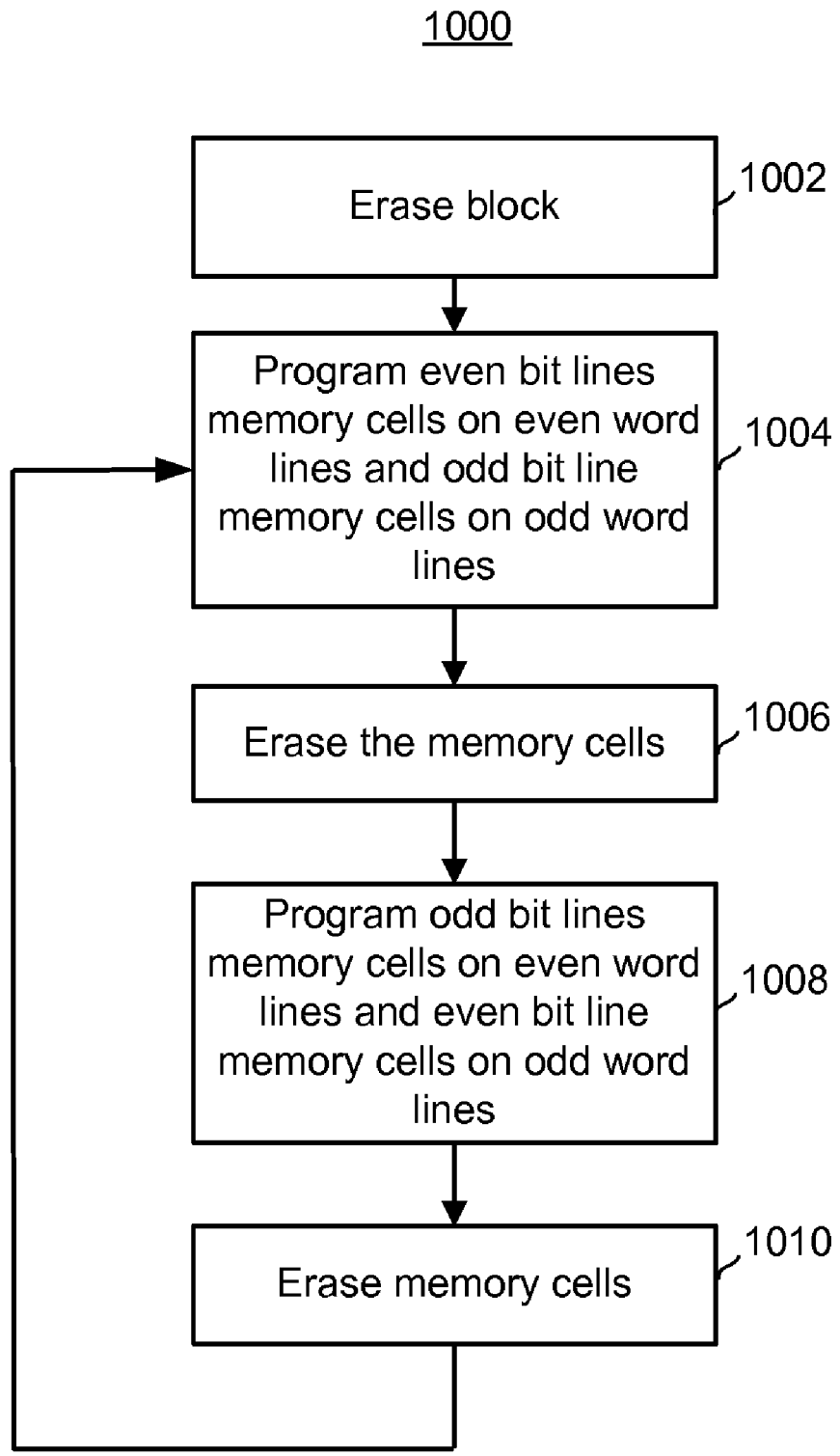
FIG. 10 depicts one embodiment of a flowchart of a process of programming a block of memory cells in a memory array in a checkerboard pattern.

FIG. 10 depicts one embodiment of a flowchart of a process 1000 of programming a block of memory cells of memory array 200 in a checkerboard pattern. In one embodiment, process 1000 is applied to SLC blocks but not to MLC blocks. However, process 1000 may also be applied to MLC blocks. In step 1002, a block of memory cells in the memory array is erased. Details of erasing a block of memory cells are discussed below. In step 1002, all memory cells in the block are erased.

In step 1004, memory cells associated with both even bit lines and even word lines are programmed and memory cells associated with both odd bit lines and odd word lines are programmed. However, other memory cells remain erased (unprogrammed). FIG. 11A depicts an example pattern that results after programming memory cells a checkerboard pattern. The memory cells that are encircled by dashed lines are those that are candidates for programming. In FIG. 11A, the memory cells have been programmed to either a "1" or a "0". However, programming could involve changing the threshold voltage to another state such as any of states 2-15 in FIGS. 6B and 6C. In other words, the block might be an MLC block. Typically, there will be many more word lines in a block. For example, there might be 64 or more word lines. Also, there are typically many more bit lines in a block. For example, there might be thousands of bit lines.

In step 1006, memory cells are erased. Because there may be programmed memory cells on each word line, erasing may involve applying erase conditions to all memory cells. For example, even a memory cell that is still in the erased state may have erase conditions applied thereto. Details of erasing memory cells are discussed with respect to FIG. 14. The erase may be triggered by a variety of events. In one aspect, SLC blocks are programmed until enough are programmed to warrant transfer to one or more MLC blocks. After the data transfer to MLC blocks, the data in the SLC blocks may be erased. The erase might also be triggered by the host sending a command to the controller 244 that indicates that all data in the block is to be erased or written with new data. Thus, it is not required that the data from the block be transferred to another block prior to the erase.

Figure 11B:
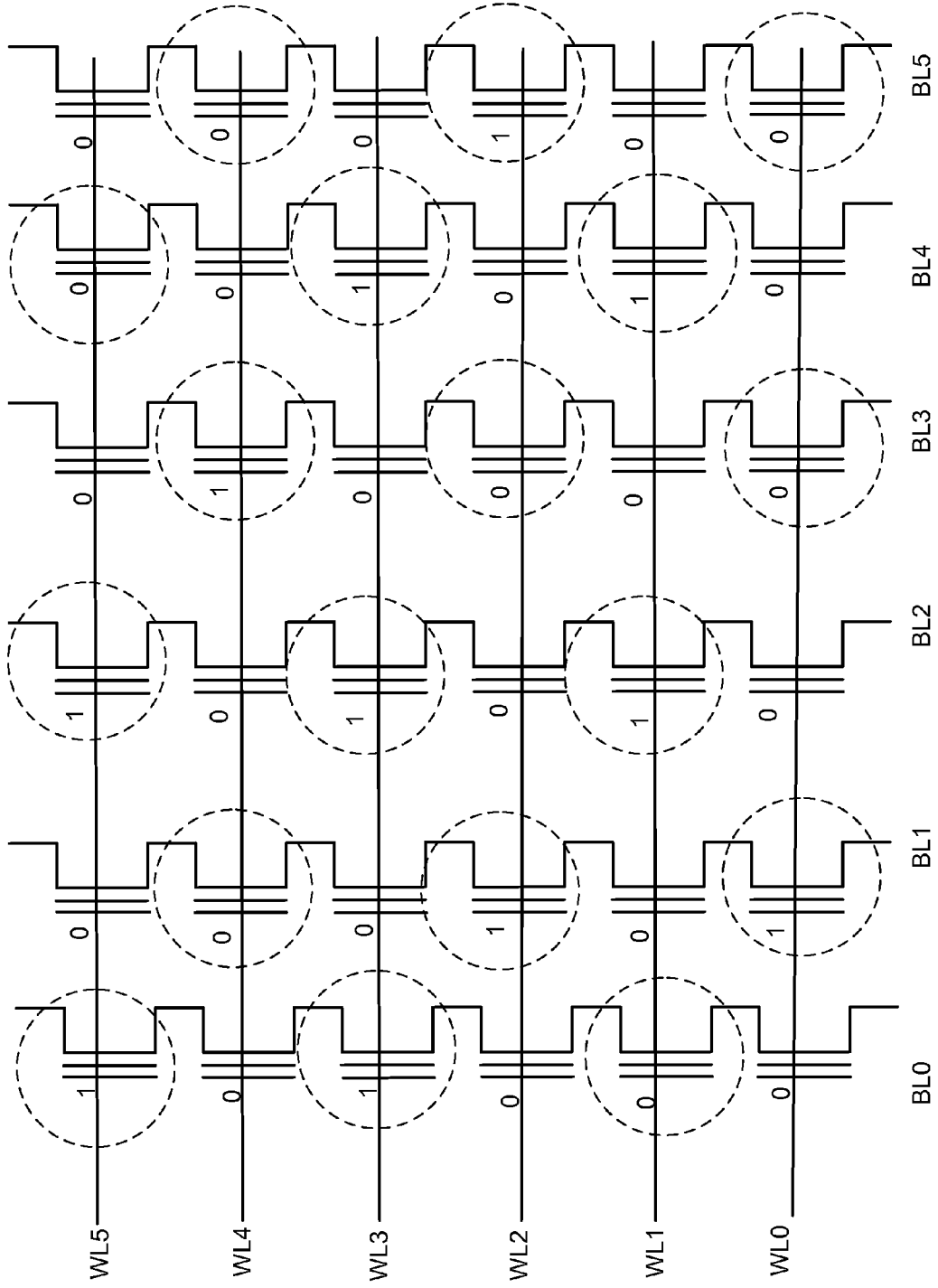

In step 1008, memory cells that were not programmed in step 1004 are programmed. In other words, the other portion of the checkerboard pattern is programmed. However, other memory cells (e.g., those programmed in step 1004) remain erased (or unprogrammed). FIG. 11B depicts an example pattern that results. In that pattern, memory cells associated with both odd bit lines and even word lines are programmed and memory cells associated with both even bit lines and odd word lines are programmed. In step 1010, the memory cells are erased. The process 1000 may then continue on by returning to step 1004.

Note that it is not required that an alternating sequence of programming one part of the checkerboard (e.g., FIG. 11A) and then the other part of the checkerboard (e.g., FIG. 11B) be maintained. In one aspect, counts are maintained of the number of program/erase cycles for each pattern. The pattern in FIG. 11A might be programmed/erased multiple times in succession prior to programming and erasing the pattern in FIG. 11B. Over time, each pattern receives the same number of program/erase cycles to level the wear. A count of the program/erase cycles for each pattern might be stored in a free memory cell of the data block itself. That is, there may be a certain number of memory cells in each block that are not for user data. Alternatively, the count could be stored elsewhere, such as a different block in the memory array 200 or memory outside of the memory array 200. Thus, in one aspect, steps 1004 and 1006 (program/erase even WLs) may be repeated many times prior to performing steps 1008 and 1010 (program/erase odd WLs).

Note that in FIGS. 11A and 11B, the neighbor memory cell on the WL above and below each programmed memory cell is not programmed. This is also true for the embodiment depicted in FIGS. 8A and 8B. Therefore, floating gate charge coupling effects that might otherwise arise from programming a memory cell on a WL above or below a given WL are greatly reduced or eliminated. Moreover, the neighbor memory cell on the bit line (BL) to the right and to the left of each programmed memory cell is not programmed. Therefore, floating gate charge coupling effects that might otherwise arise from programming a memory cell on a BL to the right and to the left are also greatly reduced or eliminated. The only remaining floating gate charge coupling effect is in the diagonal direction, for example, a programmed memory cell on $BL_n$ of $WL_n$ may still be affected by the programmed cells on $BL_{n-1}$ and $BL_{n+1}$ of $WL_{n+1}$ and/or $WL_{n-1}$.

In the checkerboard pattern of FIGS. 11A and 11B, memory cells on every other bit line (BL) for a given word line are programmed. However, it is not required that the checkerboard pattern be this dense. In order to eliminate the above described diagonal coupling effect, in one embodiment, memory cells on every fourth bit line for a given word line are programmed. In another embodiment, it is not required that every word line is programmed. For example, every fourth word line might be programmed. As an example, for WL0, the memory cells on BL0, BL4, BL8, etc. are programmed. WL1 and WL2 might remain unprogrammed. For WL3, the memory cells on BL2, BL6, BL10, etc. are programmed. Other checkerboard patterns may be used. For example each WL might be programmed, but only every fourth memory cell on each word line. In this case, the neighbor memory cell above and below a programmed memory cell remains unprogrammed. In yet another embodiment, every other wordline and every other bitline is programmed. For example, for WL0, the memory cells on BL0, BL2, BL4, etc. are programmed, WL1 remains unprogrammed. For WL2, BL0, BL2, BL4, etc. are programmed, or BL1, BL3, BL5, etc are programmed. In both latter cases, each programmed memory cell never has a neighboring cell that is in a programmed state, not even in the diagonal direction and thus floating gate charge coupling effects are almost completely eliminated.

Figure 12:
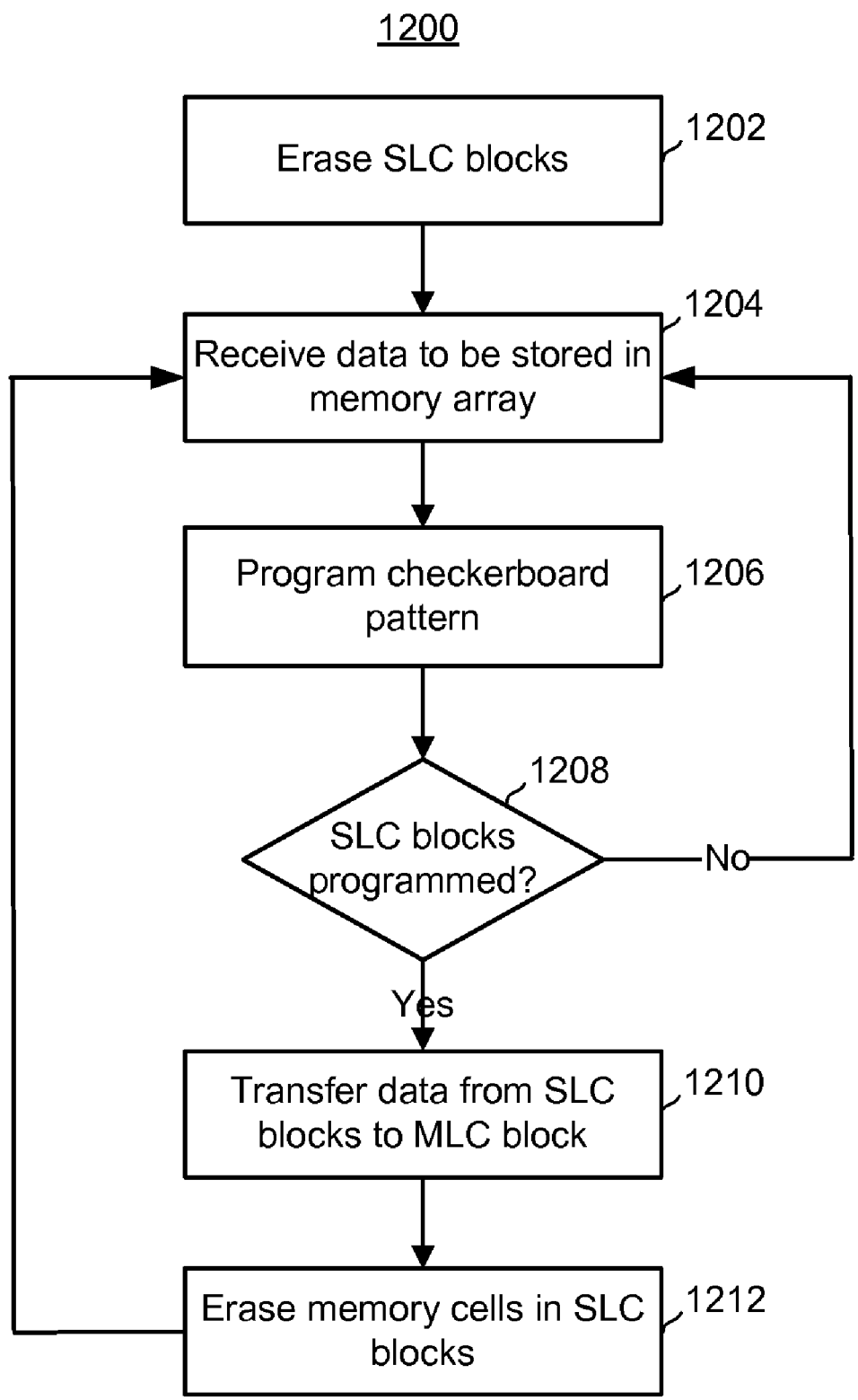
FIG. 12 depicts one embodiment of a process programming SLC and MLC blocks using a checkerboard pattern.

FIG. 12 depicts one embodiment of a process 1200 programming SLC and MLC blocks using a checkerboard pattern for SLC blocks. For purposes of discussion, an example of programming eight SLC blocks and transferring that data to one MLC block will be discussed. In this example, it takes eight SLC blocks programmed in a checkerboard pattern to fill one MLC block, although it may take more or fewer SLC blocks to fill an MLC block. In step 1202, SLC blocks are erased. Thus, at least the eight SLC blocks are erased.

In step 1204, the controller 244 receives data to be stored in the memory array 200. For example, a host sends the controller 244 user data to store. In process 1200, the controller 244 determines that the data should first be stored in SLC blocks prior to transferring the data to MLC blocks. As previously discussed, the SLC blocks may be used as a type of cache to temporarily store the data.

In step 1206, the controller 244 programs data in a checkerboard pattern. The controller 244 may program the data into more than one SLC block. If so, the controller 244 might use one checkerboard pattern (e.g., FIG. 11A) for one SLC block and another checkerboard pattern (e.g., FIG. 11B) for another SLC block. However, for clarity of discussion an example will be used in which the pattern of FIG. 11A is programmed in each of the SLC blocks.

In step 1208, the controller 244 determines whether enough SLC blocks are programmed in the checkerboard pattern to warrant transfer of the data to one or more MLC blocks. For example, the controller 244 determines that all eight SLC blocks are programmed. If not, process 1200 returns to step 1204 to receive more data to be stored in the memory array at least until enough SLC blocks are programmed to warrant transfer to MLC blocks.

Note that it is not required that the data from the SLC blocks be transferred to an MLC block as soon as possible. The controller 244 may wait until memory access is idle (e.g., the host is not accessing the memory array 200) to transfer data from SLC blocks to one or more MLC blocks. In this case, other SLC blocks are programmed until an appropriate time to transfer the data to MLC blocks.

When the controller 244 determines it is appropriate, data is transferred from the SLC blocks to one or more MLC blocks, in step 1210. Note that at this point, some of the memory cells remained erased. For example, those memory cells that are not encircled in dashed line in FIG. 11A are still erased. In the present example, the controller 244 reads in the data from all of the WLs of the eight SLC blocks, and discards the data from the memory cells that were not programmed, applies ECC to the data and then stores the data in the MLC block. It is not required that the checkerboard programming be applied to MLC blocks. Thus, all memory cells of an MLC block may be programmed.

In step 1212, memory cells in the SLC blocks are erased. After step 1212, process 1200 returns to step 1204 to receive more data to be stored in the memory array 200. However, this time data may be stored in a different checkerboard pattern (e.g., FIG. 11B). A count of the program/erase cycles for each checkerboard pattern (e.g., FIG. 11A, FIG. 11B) may be maintained to allow for wear leveling. Note that it is not required that the checkerboard patterns depicted in FIGS. 11A and 11B be used for process 1200. For example, a less dense checkerboard pattern in which memory cells on every fourth bit line (and possibly every fourth word line) are programmed may be used.

Figure 13:
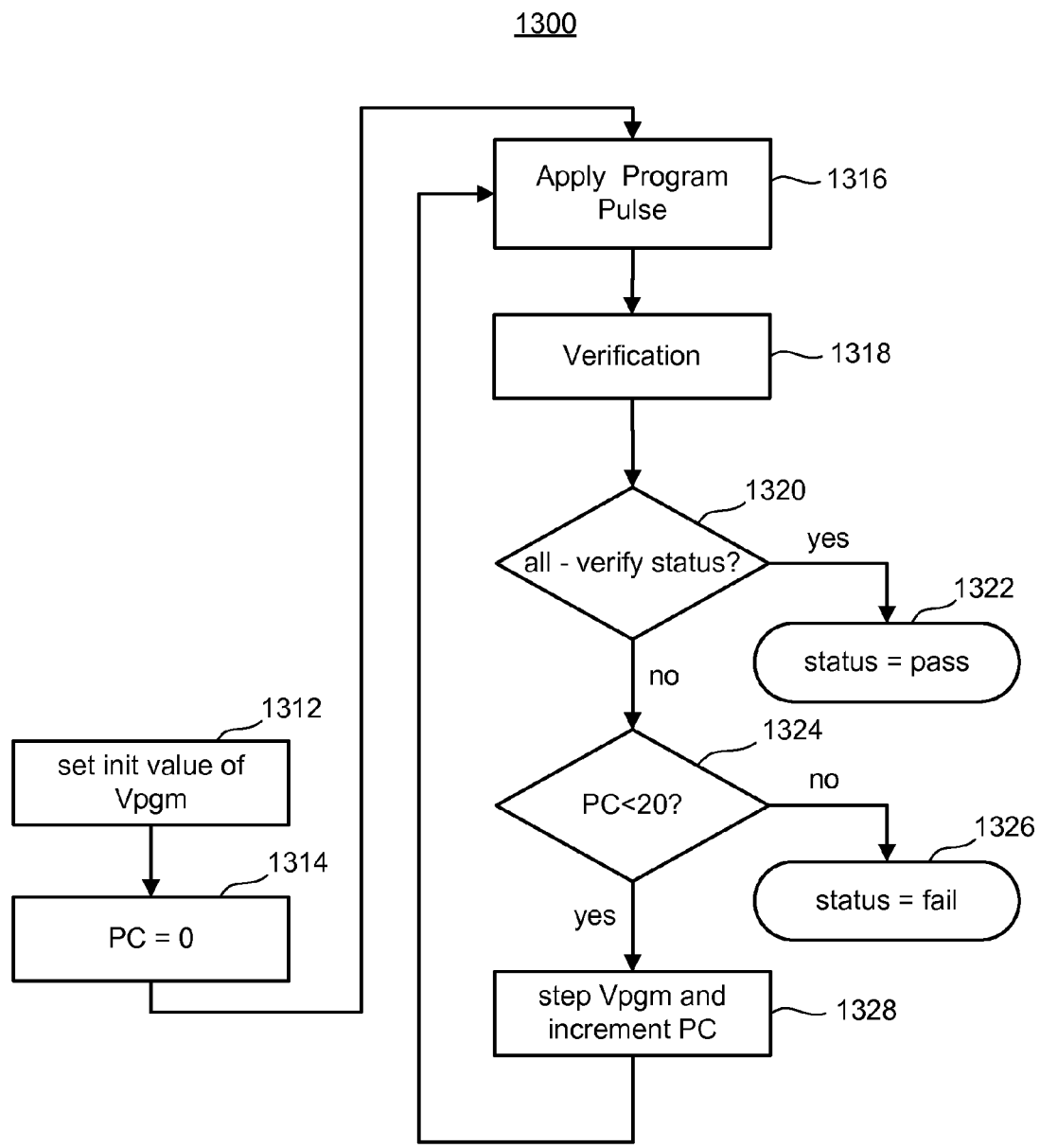
FIG. 13 is a flow chart describing details of programming memory cells.

FIG. 13 is a flow chart describing details of programming memory cells. The process 1300 of FIG. 13 can be performed in response to receiving a request to program data. Process 1300 describes programming one word line and may be repeated for each word line in a block. The phrase "programming a word line" means to program memory cells associated with a word line. In some embodiments, all memory cells on the word line are programmed at the same time. That is, memory cells associated with all bit lines (and a certain word line) are programmed together. In some embodiments, memory cells associated with odd bit lines are programmed separately from memory cells associated with even bit lines.

If used to perform step 704 of process 700, process 1300 may be performed once for each even word line in a block. If used to perform step 708, process 1300 may be performed once for each odd word line in a block. If used to perform either step 1004 or 1008 of process 1000, process 1300 may be performed once for each word line in a block with some word lines having odd bit lines programmed and others having even bit lines programmed. Programming memory cells on only selected bit lines may be achieved by locking out programming on certain bit lines.

The order in which even (or odd) word lines are programmed is not limited to a particular sequence. One example sequence is to program WL0, WL2, WL4, etc., until each even word line has been programmed. For odd word lines, the sequence may be to program WL1, WL3, WL5, etc. until each odd word line has been programmed. The word lines could be programmed in the opposite order (i.e., high to low). Also, it is not required that the word lines be programmed in sequence. For example, WL2 might be programmed after programming WL0 and WL4.

In step 1312, the system will set the magnitude of the initial program pulse. At step 1314, the program count PC will be set to initially be zero. In step 1316, a program pulse is applied to the appropriate word line(s). In step 1318, the memory cells to be programmed on that word line(s) are verified to see if they have reached the target threshold voltage level. If all or almost all of the memory cells to be programmed have reached the target threshold voltage level (step 1320), then the programming process has completed successfully (status=pass) in step 1322. If not all or almost all of the memory cells have been verified, then it is determined in step 1324 whether the program count PC is less than 20. If the program count is not less than 20, then the programming process has failed (step 1326). If the program count is less than 20, than in step 1328, the magnitude of program voltage signal Vpgm is incremented by the step size (e.g., 0.3V) for the next pulse and the program count PC is incremented. Note that those memory cells that have reached their target threshold voltage are locked out of programming for the remainder of the current programming cycle. After step 1328, the process of FIG. 13 continues at step 1316 and the next program pulse is applied. Note that another number than 20 for the program count PC can be used as stop criteria in 1324. Also not that in 1320, in some embodiments, it is not necessary that all memory cells reach the target threshold voltage. Since ECC is applied, a certain number of memory cells that do not reach the target threshold voltage level can be tolerated as these can be corrected by the ECC.

Figure 14:
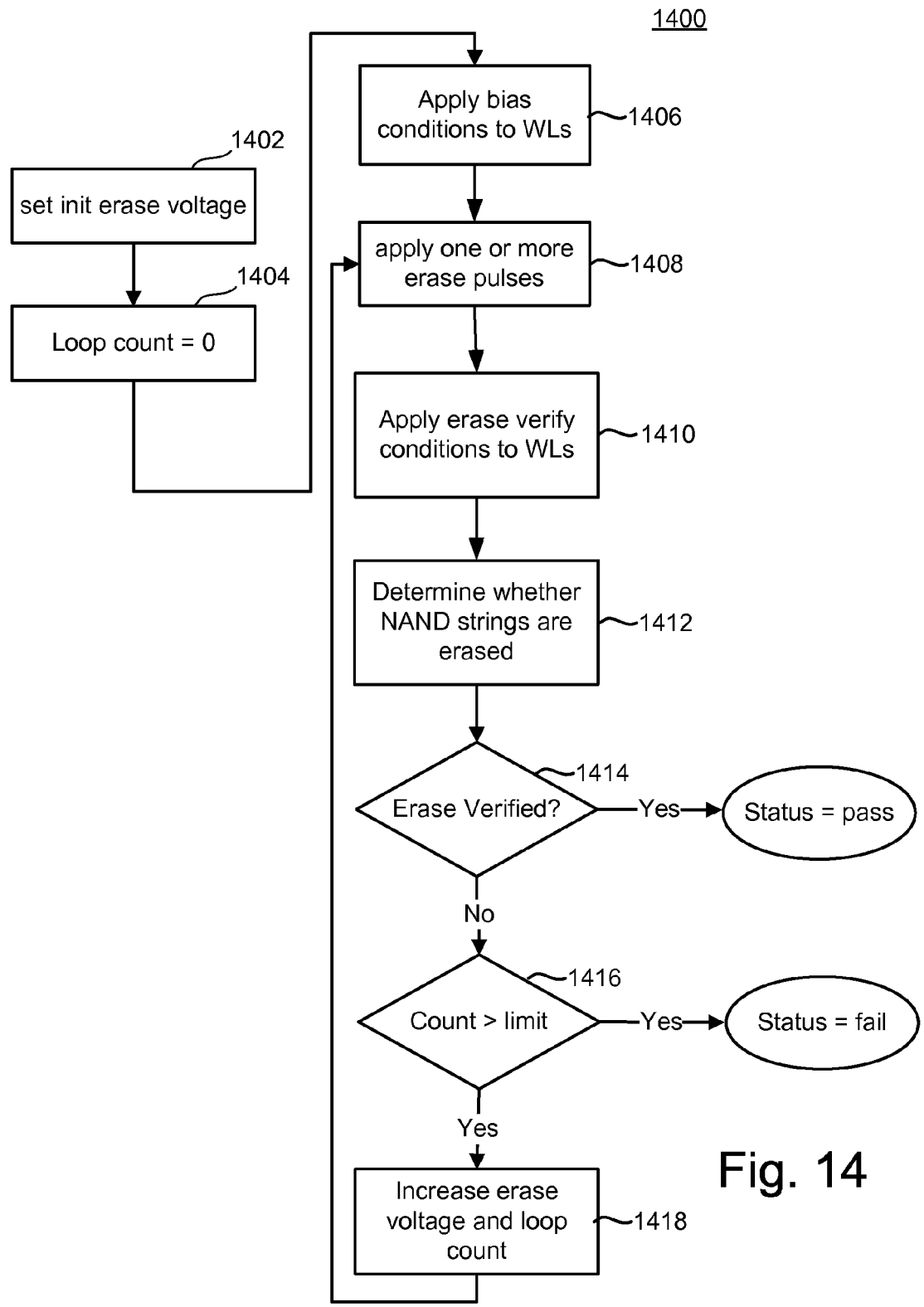
FIG. 14 is a flow chart describing details of erasing memory cells.

FIG. 14 is a flow chart describing a process 1400 for erasing memory cells. In some embodiments, some memory cells are only weakly erased and others receive a normal erase. In other embodiments, all memory cells receive a normal erase. In some embodiments, different bias conditions are applied to WLs to achieve either a normal or weak erase. The weak erase reduces stress on the memory cells.

Process 1400 is one implementation of steps 702, 706, or 710 of process 700; steps 752 or 756 of process 750; steps 902 or 912 of process 900; steps 955 or 962 of process 950; steps 1002, 1006, or 1010 of process 1000, or steps 1202 or 1212 of process 1200. In step 1402, the system will set the magnitude of the initial erase pulse. At step 1404, an erase loop count will be set to initially be zero. In step 1406, bias conditions are applied to word lines. In one embodiment different bias conditions are applied to word lines having memory cells to receive a normal erase than to word lines for which memory cells are to be weakly erased. For example, 0V may be used for word lines to receive a normal erase and a positive voltage may be applied to word lines to be weakly erased. As an example, the positive voltage may be a few volts (e.g., 1-4 Volts). In some embodiments, even and odd word lines have different voltages applied thereto. When discussing process 1400, the term "a selected word line" refers to a word line whose memory cells are to receive a normal erase and the term "a selected memory cell" refers to a memory cell to receive a normal erase. The term "an unselected word line" refers to a word line whose memory cells is to be weakly erased. Note that depending on the magnitude of the positive voltage on the unselected word lines, some erase may still occur, however, this "weak erase" is in general not significant and does not contribute to the degradation of the memory cell's characteristics.

In step 1408, erase conditions are applied. In one implementation, step 1402 includes raising the p-well to an erase voltage (e.g., 20 volts) for a sufficient period of time, grounding the selected word lines of a selected block and applying a bias voltage to unselected word lines of the selected block, while the source and bit lines are floating. Due to capacitive coupling, bit lines, select lines, and the common source line are also raised to a significant fraction of the erase voltage. A strong electric field is thus applied to the tunnel oxide layers of selected memory cells and the data of the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of cells.

However, by applying a bias voltage to the unselected word lines, the unselected memory cells do not experience such a strong electric field across their tunnel oxide layers. Therefore, the unselected memory cells do not suffer significant stress from erase. In some embodiments, the unselected memory cells are already erased, therefore their threshold voltage will not be significantly altered by the above mentioned "weak erase" bias condition. However, note that it is not an absolute requirement that the unselected memory cells be in the erased state prior to beginning process 1400. That is, the unselected memory cells may contain data prior to being weakly erased.

In step 1410, a set of erase verify conditions are applied to the memory cells. This is a selective erase verify in some embodiments. Note that the verify conditions may be different for selected and unselected word lines because some memory cells may be assumed to be erased even prior to the erase process. For example, if it is assumed that the unselected memory cells in the selected block are already erased because they were not programmed since the last complete erase, then a read pass voltage may be applied to unselected WLs.

In one implementation, step 1410 includes discharging bit lines to ground, Then, a higher than zero voltage (e.g., 2.2V) is applied to the common source line and a certain voltage (e.g., 0V) is applied to the selected word lines and another voltage (e.g., Vread) is applied to unselected word lines. Vread may be a voltage that is sufficiently high such that the memory cells will conduct a current. Charge builds up on the bit line, resulting in an increase of the bit line voltage of a given NAND string until the body effect turns off at least one memory cell in the NAND string.

In step 1412, each of the NAND strings is sensed to determine whether the memory cells on the NAND string were sufficiently erased. Step 1406 is performed after waiting for a predetermined period of time for the charge to build up on the bit line. In one implementation, the voltage on a given bit line is compared to a reference value to determine whether any of the memory cells on the corresponding NAND string have a Vt that is above the target value. The target value could be a negative value.

In one embodiment, if it is detected that the Vt of each memory cell on a NAND string has reached the target level, then the data stored in the corresponding data latch is changed to a logic "1." If it is detected that the NAND string has at least one memory cell with a Vt that has not reached the appropriate target level, the data stored in the corresponding data latch is not changed.

In step 1414, a determination is made as to whether enough NAND strings passed erase verification. In one implementation, a certain number of NAND strings are allowed to fail erase verification. For example, providing that fewer than 32 NAND strings failed erase verification, the overall erase verification passes. If erase passed, then the erase status is set to pass and process 1400 ends.

If, at step 1414, it is determined that erase verification failed, then the loop count is checked (step 1416) to determine whether it is over a limit. If so, the erase status is set to fail and process 1400 ends. If the loop count is not over the limit, then the erase voltage is increased in step 1418. The erase voltage can be increased by any desired amount such as 0.2 V, 0.5 V, 1.0 V, etc. The loop count is incremented. The new erase voltage is applied in step 1408.

As disclosed herein, one embodiment is a method of operating non-volatile storage having a group of plurality of non-volatile storage elements and a plurality of word lines. The method comprises erasing a plurality of non-volatile storage elements and programming data in a first group of the plurality of non-volatile storage elements while leaving unprogrammed a second group of the plurality of non-volatile storage elements. For every non-volatile storage element in the first group any neighbor non-volatile storage element on a word line either above or below the non-volatile storage element in the first group is a member of the second group that remains unprogrammed. The data in at least the first group of non-volatile storage elements are erased while the second group of non-volatile storage elements remain unprogrammed. Later, the at least a portion of the second group of the non-volatile storage elements are programmed. For every non-volatile storage element in the portion of the second group any neighbor non-volatile storage element on a word line either above or below the non-volatile storage element in the portion of the second group remains unprogrammed. Later, data in the at least a portion of the second group of non-volatile storage elements is erased while the neighbor non-volatile storage elements on word lines either above or below the non-volatile storage element in the at least the portion of the second group remain unprogrammed.

In one embodiment, the plurality of non-volatile storage elements discussed in the preceding paragraph are part of a block in which data is stored one bit per non-volatile storage element and the non-volatile storage further includes multi-level blocks of non-volatile storage elements in which more than one bit of data is stored per non-volatile storage element. In one embodiment, the method further comprises transferring the data programmed in the first group of non-volatile storage elements associated to one or more of the multi-level blocks while the second group of non-volatile storage elements remain unprogrammed, and transferring the data programmed in the at least the portion of the second group of non-volatile storage elements to one or more of the multi-level blocks while the neighbor non-volatile storage elements on word lines either above or below the non-volatile storage elements in the at least the portion of the second group remain unprogrammed.

In another embodiment, the first group of non-volatile storage elements are non-volatile storage elements associated with both an even bit line of the plurality of bit lines and an even word line of the plurality word lines and both an odd bit line of the plurality of bit lines and an odd word line of the plurality word lines. The second group are non-volatile storage elements associated with both an odd bit line and an even word line and both an even bit line and an odd word line. In this case, the at least a portion of the second group is the entire second group.

One embodiment is a method of operating non-volatile storage having a plurality of non-volatile storage elements and a plurality of word lines associated with the plurality of non-volatile storage elements. The method includes erasing data in a first group of non-volatile storage elements, weakly erasing a second group of the non-volatile storage elements, programming data in the first group of the plurality of non-volatile storage elements while not programming the second group of the plurality of non-volatile storage elements; for every non-volatile storage element in the first group any neighbor non-volatile storage element on a word line either above or below the non-volatile storage element in the first group is a member of the second group that is not programmed. The method further includes erasing data in the second group of non-volatile storage elements at a time when the second group of non-volatile storage elements are still weakly erased, and programming the second group of the non-volatile storage elements; for every non-volatile storage element in the second group any neighbor non-volatile storage element on a word line either above or below the non-volatile storage element in the second group is not programmed.

One embodiment is a method of operating non-volatile storage comprising single-level blocks and multi-level blocks. The single-level blocks each include a plurality of word lines and a plurality of non-volatile storage elements. The method includes erasing non-volatile storage elements associated with all word lines in a first single-level block of the single-level blocks, and programming data in non-volatile storage elements in a checkerboard pattern in the first single-level block. At least half of the non-volatile storage elements in the first single-level block remain unprogrammed. The data from the non-volatile storage elements associated with the checkerboard pattern in the first single-level block is transferred to a first multi-level block of the multi-level blocks while the at least half of the non-volatile storage elements in the first single-level block remain erased. The data in the first single-level block is erased.

In a further embodiment, the checkerboard pattern of the previous paragraph is a first checkerboard pattern. Data is programmed in non-volatile storage elements in a second checkerboard pattern in the first single-level block. Non-volatile storage elements that were programmed in the first checkerboard pattern are not programmed using the second checkerboard pattern. The data from the non-volatile storage elements associated with the second checkerboard pattern in the first single-level block is transferred to a second multi-level block of the multi-level blocks while non-volatile storage elements associated with the first checkerboard pattern line remain erased.

One embodiment is a non-volatile storage device comprising a plurality of non-volatile storage elements, a plurality of word lines associated with the group of non-volatile storage elements. and one or more managing circuits in communication with the non-volatile storage elements. The one or more managing circuits erase the non-volatile storage elements. The one or more managing circuits program data in a first group of the plurality of non-volatile storage elements while leaving unprogrammed a second group of the plurality of non-volatile storage elements. For every non-volatile storage element in the first group any neighbor non-volatile storage element on a word line either above or below the non-volatile storage element in the first group is a member of the second group that remains unprogrammed. The one or more managing circuits erase the data in the first group of non-volatile storage elements while the second group of non-volatile storage elements remain unprogrammed. The one or more managing circuits program at least a portion of the second group of the non-volatile storage elements. For every non-volatile storage element in the portion of the second group any neighbor non-volatile storage element on a word line either above or below non-volatile storage element in the portion of the second group remains unprogrammed. The one or more managing circuits erase data in the at least the portion of the second group of non-volatile storage elements while the neighbor non-volatile storage elements on word lines either above or below the non-volatile storage element in the at least the portion of the second group remain unprogrammed.

In one embodiment, the non-volatile storage device of the previous paragraph further includes a plurality of bit lines associated with the group of non-volatile storage elements. The first group includes non-volatile storage elements associated with both an even bit line of the plurality of bit lines and an even word line of the plurality of word lines and both an odd bit line of the plurality of bit lines and an odd word line of the plurality of bit lines. The second group includes non-volatile storage elements associated with both an odd bit line and an even word line and both an even bit line and an odd word line. In another embodiment, the first group includes non-volatile storage elements associated with even word lines of the plurality of word lines and the second group includes non-volatile storage elements associated with odd word lines of the plurality of word lines.

One embodiment is a non-volatile storage device including a first group of non-volatile storage elements, a second group of non-volatile storage elements, a plurality of word lines associated with the first group of non-volatile storage elements, and one or more managing circuits in communication with the first group of non-volatile storage elements and the second group of non-volatile storage elements. The one or more managing circuits store one bit of data per non-volatile storage element in the first group. The one or more managing circuits store multiple bits of data per non-volatile storage element in the second group. The one or more managing circuits erase the first group of non-volatile storage elements. The one or more managing circuits program data in non-volatile storage elements associated with even word lines of the plurality word lines while leaving non-volatile storage elements associated with odd word lines of the plurality word lines erased. The one or more managing circuits transfer the data from the non-volatile storage elements associated with the even word lines to the second group of non-volatile storage elements while non-volatile storage elements associated with the odd word lines remain erased. The one or more managing circuits erase the data in the non-volatile storage elements associated with the even word lines.

One embodiment is a non-volatile storage device comprising a first group of non-volatile storage elements, a second group of non-volatile storage elements, a plurality of word lines associated with the first group of non-volatile storage elements, a plurality of bit lines associated with the first group of non-volatile storage elements, and one or more managing circuits in communication with the first group of non-volatile storage elements and the second group of non-volatile storage elements. The one or more managing circuits store one bit of data per non-volatile storage element in the first group. The one or more managing circuits store multiple bits of data per non-volatile storage element in the second group. The one or more managing circuits erase the first group of non-volatile storage elements. The one or more managing circuits program data in non-volatile storage elements in a checkerboard pattern in the first group. At least half of the non-volatile storage elements in the first group remain unprogrammed. The one or more managing circuits transfer the data from the non-volatile storage elements associated with the checkerboard pattern in the first group to a first subset of non-volatile storage element in the second group of non-volatile storage elements. The one or more managing circuits erase the data in the first group.

In a further embodiment, the checkerboard pattern of the previous paragraph is a first checkerboard pattern. The one or more managing circuits program data in non-volatile storage elements in a second checkerboard pattern in the first group. Non-volatile storage elements that were programmed in the first checkerboard pattern are not programmed using the second checkerboard pattern. The one or more managing circuits transfer the data from the non-volatile storage elements associated with the second checkerboard pattern in the first group to a second subset of non-volatile storage elements in the second group while non-volatile storage elements associated with the first checkerboard pattern remain erased.

Yet another embodiment is a method of operating non-volatile storage comprising single-level blocks and multi-level blocks. The single-level blocks each include a plurality of word lines and a plurality of non-volatile storage elements. The method includes: performing a normal erase of non-volatile storage elements associated with even word lines in a first block of the single-level blocks while weakly erasing non-volatile storage elements associated with odd word lines in the first block, programming data in non-volatile storage elements associated with the even word lines of the plurality of word lines. Non-volatile storage elements associated with the odd word lines are not programmed. Data from the non-volatile storage elements associated with the even word lines is transferred to one or more of the multi-level cell blocks, the transferring occurs while non-volatile storage elements associated with the odd word lines remain weakly erased.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method of operating non-volatile storage having a plurality of non-volatile storage elements and a plurality of word lines associated with the plurality of non-volatile storage elements, the method comprising:
    erasing the plurality of non-volatile storage elements;
    programming data in a first group of the plurality of non-volatile storage elements while leaving unprogrammed a second group of the plurality of non-volatile storage elements, for every non-volatile storage element in the first group any neighbor non-volatile storage element on a word line either above or below the non-volatile storage element in the first group is a member of the second group that remains unprogrammed;
    erasing the data in at least the first group of non-volatile storage elements while the second group of non-volatile storage elements remain unprogrammed;
    programming at least a portion of the second group of the non-volatile storage elements, for every non-volatile storage element in the portion of the second group any neighbor non-volatile storage element on a word line either above or below the non-volatile storage element in the portion of the second group remains unprogrammed; and
    erasing data in the at least a portion of the second group of non-volatile storage elements while the neighbor non-volatile storage elements on word lines either above or below the non-volatile storage element in the at least the portion of the second group remain unprogrammed.

2. The method of claim 1, wherein the plurality of non-volatile storage elements are part of a block in which data is stored one bit per non-volatile storage element and the non-volatile storage further includes multi-level blocks of non-volatile storage elements in which more than one bit of data is stored per non-volatile storage element.

3. The method of claim 2 further comprising:
    transferring the data programmed in the first group of non-volatile storage elements to one or more of the multi-level blocks while the second group of non-volatile storage elements associated remain unprogrammed; and
    transferring the data programmed in the at least the portion of the second group of non-volatile storage elements to one or more of the multi-level blocks while the neighbor non-volatile storage elements on word lines either above or below the non-volatile storage element in the at least the portion of the second group remain unprogrammed.

4. The method of claim 1 wherein the first group are non-volatile storage elements associated with both an even bit line of the plurality of bit lines and an even word line of the plurality word lines and both an odd bit line of the plurality of bit lines and an odd word line of the plurality word lines, the second group are non-volatile storage elements associated with both an odd bit line and an even word line and both an even bit line and an odd word line, the at least a portion of the second group is the entire second group.

5. The method of claim 1 wherein the first group are non-volatile storage elements associated with even word lines of the plurality of word lines and the second group are non-volatile storage elements associated with odd word lines of the plurality of word lines, the at least a portion of the second group is the entire second group.

6. The method of claim 5 wherein the erasing the data in the first group of non-volatile storage elements while the second group of non-volatile storage elements remain unprogrammed includes performing a selective erase of the non-volatile storage elements associated with the even word lines without erasing the non-volatile storage elements associated with the odd word lines.

7. The method of claim 6 wherein the performing a selective erase of the non-volatile storage elements associated with the even word lines without erasing the non-volatile storage elements associated with the odd word lines includes performing an erase verify of the even word lines without performing an erase verify of the odd word lines.

8. The method of claim 7 wherein the erasing the data in the first group of non-volatile storage elements while the second group of non-volatile storage elements remain unprogrammed includes:
    applying one or more erase pulses to the plurality of non-volatile storage elements;
    applying a first voltage to the odd word lines while applying the one or more erase pulses; and
    applying a second voltage to the even word lines while applying the one or more erase pulses, the first voltage is higher than the second voltage.

9. The method of claim 8 wherein the applying a second voltage to the even word lines while applying the one or more erase pulses creates a strong electric field across tunnel oxide layers of the non-volatile storage elements associated with the even word lines, the applying a first voltage to the odd word lines while applying the one or more erase pulses creates a less strong electric field across tunnel oxide layers of the non-volatile storage elements associated with the odd word lines.

10. The method of claim 9 wherein the erasing the data in the first group of non-volatile storage elements while the second group of non-volatile storage elements remain unprogrammed includes performing an erase verify by:
applying a read voltage to the odd word lines;
applying a voltage that is less than the read voltage to the even word lines;
sensing a condition of a bit line associated with a first subset of non-volatile storage elements of the plurality of non-volatile storage elements; and
determining whether the first subset of non-volatile storage elements are erased based on the condition.

11. The method of claim 1 wherein the programming data in a first group includes programming non-volatile storage elements that are associated with every third word line of the plurality of word lines.

12. A non-volatile storage device comprising:
a plurality of non-volatile storage elements;
a plurality of word lines associated with the group of non-volatile storage elements; and
one or more managing circuits in communication with the non-volatile storage elements, the one or more managing circuits erase the non-volatile storage elements, the one or more managing circuits program data in a first group of the plurality of non-volatile storage elements while leaving unprogrammed a second group of the plurality of non-volatile storage elements, for every non-volatile storage element in the first group any neighbor non-volatile storage element on a word line either above or below the non-volatile storage element in the first group is a member of the second group that remains unprogrammed, the one or more managing circuits erase the data in the first group of non-volatile storage elements while the second group of non-volatile storage elements remain unprogrammed, the one or more managing circuits program at least a portion of the second group of the non-volatile storage elements, for every non-volatile storage element in the portion of the second group any neighbor non-volatile storage element on a word line either above or below non-volatile storage element in the portion of the second group remains unprogrammed, the one or more managing circuits erase data in the at least the portion of the second group of non-volatile storage elements while the neighbor non-volatile storage elements on word lines either above or below the non-volatile storage element in the at least the portion of the second group remain unprogrammed.

13. The non-volatile storage device of claim 12, further comprising a plurality of bit lines associated with the group of non-volatile storage elements, the first group includes non-volatile storage elements associated with both an even bit line of the plurality of bit lines and an even word line of the plurality of word lines and both an odd bit line of the plurality of bit lines and an odd word line of the plurality of bit lines, the second group includes non-volatile storage elements associated with both an odd bit line and an even word line and both an even bit line and an odd word line.

14. The non-volatile storage device of claim 12, wherein the first group includes non-volatile storage elements associated with even word lines of the plurality of word lines and the second group includes non-volatile storage elements associated with odd word lines of the plurality of word lines.

15. The non-volatile storage device of claim 14, wherein the one or more managing circuits perform a selective erase of the non-volatile storage elements associated with the even word lines without erasing the non-volatile storage elements associated with the odd word lines.

16. The non-volatile storage device of claim 15, wherein the one or more managing circuits performing a selective erase of the non-volatile storage elements associated with the even word lines includes the one or more managing circuits applying one or more erase pulses to the plurality of non-volatile storage elements, the one or more managing circuits apply a first voltage to the odd word lines while applying the one or more erase pulses, the one or more managing circuits apply a second voltage to the even word lines while applying the one or more erase pulses, the first voltage is higher than the second voltage.

17. The non-volatile storage device of claim 16, wherein the one or more managing circuits applying a second voltage to the even word lines while applying the one or more erase pulses creates a strong electric field across tunnel oxide layers of the non-volatile storage elements associated with the even word lines, the one or more managing circuits applying a first voltage to the odd word lines while applying the one or more erase pulses does create a less strong electric field across tunnel oxide layers of the non-volatile storage elements associated with the odd word lines.

18. The non-volatile storage device of claim 12, wherein the one or more managing circuits perform wear-leveling based on the number of times that the first group of non-volatile storage elements have been erased and the number of times that the second group of non-volatile storage elements have been erased.

19. The non-volatile storage device of claim 12, wherein the plurality of non-volatile storage elements are part of a block in which data is stored one bit per non-volatile storage element and the non-volatile storage further includes multi-level blocks of non-volatile storage elements in which more than one bit of data is stored per non-volatile storage element.

20. The non-volatile storage device of claim 19, wherein the one or more managing circuits transfer the data programmed in the first group of non-volatile storage elements associated to one or more of the multi-level blocks while the second group of non-volatile storage elements associated remain unprogrammed, the one or more managing circuits transfer the data programmed in the at least the portion of the second group of non-volatile storage elements to one or more of the multi-level blocks while the neighbor non-volatile storage elements on word lines either above or below the non-volatile storage element in the at least the portion of the second group remain unprogrammed.

* * * * *